United States Patent
Davis et al.

(10) Patent No.: US 9,668,360 B2
(45) Date of Patent: *May 30, 2017

(54) POLYAMIDEIMIDE ADHESIVES FOR PRINTED CIRCUIT BOARDS

(75) Inventors: Richard Charles Davis, Bath (GB);
Simon Richard Ford, Bath (GB);
Stephen Anthony Hall, Wells (GB);
Matthias Klaus, Strausberg (DE);
Karl-Heinz Ognibeni, Kirchheimbolanden (DE)

(73) Assignee: Sun Chemical Corporation, Parsippany, NJ (US)

( * ) Notice: Subject to any disclaimer, the term of this patent is extended or adjusted under 35 U.S.C. 154(b) by 114 days.

This patent is subject to a terminal disclaimer.

(21) Appl. No.: 13/504,792

(22) PCT Filed: Oct. 28, 2010

(86) PCT No.: PCT/EP2010/066411
§ 371 (c)(1),
(2), (4) Date: Apr. 27, 2012

(87) PCT Pub. No.: WO2011/051412
PCT Pub. Date: May 5, 2011

(65) Prior Publication Data
US 2012/0222889 A1    Sep. 6, 2012

Related U.S. Application Data

(60) Provisional application No. 61/255,895, filed on Oct. 29, 2009, provisional application No. 61/380,373, filed on Sep. 7, 2010.

(51) Int. Cl.
| | |
|---|---|
| C08G 73/14 | (2006.01) |
| C09J 177/08 | (2006.01) |
| H05K 3/38 | (2006.01) |
| C08G 18/34 | (2006.01) |
| C09J 175/04 | (2006.01) |
| C09J 179/08 | (2006.01) |
| H05K 1/03 | (2006.01) |
| H05K 3/46 | (2006.01) |

(52) U.S. Cl.
CPC ........... *H05K 3/386* (2013.01); *C08G 18/345* (2013.01); *C08G 73/14* (2013.01); *C09J 175/04* (2013.01); *C09J 179/08* (2013.01); *H05K 1/0393* (2013.01); *H05K 3/4691* (2013.01); *H05K 2201/0154* (2013.01)

(58) Field of Classification Search
None
See application file for complete search history.

(56) References Cited

U.S. PATENT DOCUMENTS

| | | | |
|---|---|---|---|
| 4,448,844 A * | 5/1984 | Osada et al. | 428/375 |
| 4,497,944 A | 2/1985 | Nishizawa et al. | |
| 4,530,975 A * | 7/1985 | Mukoyama et al. | 525/423 |
| 4,600,729 A | 7/1986 | Zecher et al. | |
| 4,628,079 A * | 12/1986 | Zecher et al. | 528/49 |
| 2006/0241239 A1 | 10/2006 | Hwang et al. | |
| 2008/0146764 A1 | 6/2008 | Gertzmann et al. | |
| 2009/0277666 A1 * | 11/2009 | Yamauchi et al. | 174/119 C |
| 2010/0231345 A1 * | 9/2010 | Kikuchi et al. | 336/222 |
| 2012/0000696 A1 * | 1/2012 | Hall et al. | 174/254 |

FOREIGN PATENT DOCUMENTS

| | | | |
|---|---|---|---|
| EP | 2070961 A1 | 6/2009 | |
| EP | 2103641 A1 | 9/2009 | |
| GB | 2084162 A | 4/1982 | |
| JP | 57-111352 A * | 7/1982 | |
| JP | 58-80326 A | 5/1983 | |
| JP | 62-263692S S | 11/1987 | |
| JP | 03-181511 | 8/1991 | |
| JP | 2987950 | 12/1999 | |
| JP | 2007-100079 A * | 4/2007 | |
| JP | 2009-149757 A * | 7/2009 | |
| WO | WO 2008/004491 A1 * | 1/2008 | |
| WO | 2008/072495 A1 | 6/2008 | |

OTHER PUBLICATIONS

SunChemical, "New Materials for Flex- and Rigid/Flex-Circuitry From Sun Chemical," Munich, Germany, Nov. 2009, 45 pages.*
"Phenol Blocked Polyisocyanate Super CY Stable", downloaded from http://www.superurecoat.com/super-cy~-stable.htm on Mar. 4, 2014.
"Dispersity"—downloaded from http://en.wikipedia.org/wiki/polydispersity_index on Mar. 12, 2014.
Liu, De-hui et al., "Synthesis of a Polyamide-imide by Blocking End Groups", Insulating Materials (2002), No. 1, pp. 9-11 (with English translation).
English language translation of JP 2009-149757 published Jul. 9, 2009 with Certification of true and accurate English language translation.

* cited by examiner

*Primary Examiner* — Ana Woodward
(74) *Attorney, Agent, or Firm* — Frost Brown Todd LLC

(57) ABSTRACT

The present invention relates to curable, liquid, adhesive compositions comprising polyamideimide resins for use in bonding layers of material in metal clad laminate materials for electronic components, such as flexible circuit boards. In particular, the invention relates to liquid adhesive compositions comprising polyamideimides having a terminal isocyanate group blocked by a thermally-dissociatable isocyanate-blocking group and the use of such compositions in preparation of flexible electronic components.

25 Claims, 6 Drawing Sheets

POLYAMIDEIMIDE ADHESIVES FOR PRINTED CIRCUIT BOARDS

This application is a national stage application of PCT/EP2010/066411, filed Oct. 28, 2010, which claims priority from U.S. Patent Application Nos. 61/255,895 and 61/380,373, filed on Oct. 29, 2009 and Sep. 7, 2010, respectively, all of which are incorporated herein by reference in their entirety.

FIELD OF THE INVENTION

The present invention relates materials for use in curable compositions for use as adhesives for electronic components, such as flexible circuit boards. In particular, the invention relates to curable liquid adhesive compositions comprising polyamideimide resins and the use of such liquid adhesive compositions in the formation of electronic components.

BACKGROUND

Flexible printed circuit boards (FPCs) and rigid-flexible printed circuit boards constitute an increasingly strong growth area in printed circuit board manufacturing, as they offer numerous advantages over rigid circuit panels. FPC's and rigid-flexible printed circuit boards offer electronic equipment manufacturers the advantage of flexibility and compact high density wiring with high reliability, weight reduction and an overall cost saving. FPC's have been in use since the late 50's/early 60's mainly in military/space applications, however more recently they are more commonly found in retail products such as cameras, mobile phones and MP3 players.

The current manufacturing techniques for producing FPC's are described in *Printed Circuit Board Materials Handbook* by Martin W. Jawitz, McGraw-Hill Professional, 1997, page 784. This highly detailed book explains FPC construction and describes/discusses the assembly steps involved.

Rigid-flexible circuit boards are constructed from a flexible inner layer onto which a rigid out layer is applied to one, or more typically both, sides. In order to combine the flexible part of a rigid/flex circuit board with the rigid part, the use of No Flow Prepreg is typically necessary to give adhesion between the surface layer (usually the coverlay) of the flexible part and the rigid part of the rigid/flex circuit board. "No Flow Prepregs" are solid materials which are used as adhesive layers in lamination processes. Typically they comprise a fabric reinforcement that has been pre-impregnated with a resin and partially cured. No Flow Prepregs have a very high melt viscosity so that during the lamination cycle in which heat and pressure is applied to the Prepreg to fully cure the Prepreg and form an adhesive bond, minimal flow of the liquefied resin is observed. Ideally, the flow of the resin is sufficient to enable a good bond to be formed but not enough to result in substantial "bleed" or "leakage" out from the area it is required. "No Flow Prepregs" may alternatively be referred to a "Low Flow Prepregs". Two of these Prepregs are needed for each side and they need to be exactly cut to size with low tolerances. The adhesion between the rigid and flexible layers is typically achieved through another press cycle. After thermal cycling, the adhesion achieved using Prepreg is a potential weak point.

Adhesive layers are typically used in the preparation of laminate materials in electronic components, for example to bond flexible or rigid layers in the preparation of a multilayer laminate. Adhesives are also used in the preparation of electronic components to bond stiffener materials and/or heat sinks to the base material, such as to a circuit board base material.

Adhesives may be either supplied as liquid or as dry films in the form of sheets or rolls, either pre-applied to a laminate layer, such as on the back of a coverlay layer or as a separate sheet or roll of adhesive, the adhesive side or sides of such film often being coated with a release paper. The use of dry film adhesives involves high cost in terms of manpower, material consumption (including wastage) and energy time expenditure. These dry film sheets or rolls can only be applied using a time and cost intensive processes, especially if they are to be used only on selected areas of a panel. To apply adhesives in the form of dry sheets or rolls to the selected areas would require multiple process steps. For example:

1. Cutting those areas from a sheet or a roll by use of laser cutter or cut plotter.
2. Manually removing the protective layer from the adhesive side.
3. Positioning the adhesive (and the laminate layer if separate) onto the panel in manual operation with best possible accuracy (>0.8 mm).
4. Fixing the adhesive in manual process using a soldering tool.

While it is possible to carry out steps 1-4 by use of automation (e.g. robots) saving significant manual labor and associated expenses, it can be appreciated that the cost of investing in and operating the multiple robots necessary to carry out these operations sequentially is extremely high.

In the electronics industry, acrylic adhesives and epoxy adhesives (in both liquid and dry film form) are traditionally used. However, those traditional adhesives can encounter technical issues when used in combination with polyimide coverlays including humidity absorption, smearing, dust and limited accuracy of positioning which does not conform to modern technical requirements.

Other associated problems with using dry film adhesives for mechanical processes such as flexible printed circuits (FPCs) as well as other printed circuit boards (PCBs) and other electronic components include:

Limited accuracy (0.8 mm minimum) due to manual positioning of the films.

Dimensional problems across the z axis.

Foil instability due to manual mounting and press processes.

Compatible only with selective metallization processes. Acrylic adhesive bleeds therefore plasma desmear* required as an additional process step.

Technical problems arise with machining, drilling and routing which include smear and dust.

Each process cycle is very time consuming.

*A general description of "smear" and "desmear" can be found in the following reference: *A Comprehensive Guide to the Design and Manufacture of Printed Circuit Board Assemblies*—Volume 2, William Macleod Ross, Electrochemical Publications, page 232.

Polyamideimides are thermoplastic amorphous polymers that have exceptional mechanical, thermal and chemical resistant properties. These materials can be used in a variety of electronic applications including Printed Circuit Boards (PCBs), Photovoltaic's, Displays and Membrane Switches. As traditional polyimides used in these areas are applied as dry-film adhesive sheets, there is a limit to how these devices can be fabricated.

U.S. Pat. No. 7,364,799 (Toyo Boseki) and WO 2008/072495 (Toyo Boseki) disclose polyamideimide (PAI) resins for application to a flexible medal-clad laminate.

WO 2008/041426 (Hitachi) (also published as EP 2 070 961) discloses a polyamideimide (PAI) resin for a flexible printed circuit board. The PAI has at least one terminal functional group selected from a carbonyl group, an amino group, an acid anhydride group and a mercapto group to enhance the heat resistance.

Liquid compositions comprising solutions of polyamideimides are disclosed in WO2008/041426A1 (republished in English as US2010/0170701 A1) and US 2007/0166559 A1 for use as adhesives and a coverlays for flexible printed circuit boards.

A problem exists in the use of polyamideimide (PAI) resins in that they show poor viscosity stability, this is due to the fact that residual isocyanate groups remaining from the synthesis can react with pendent carboxylic acid groups causing the viscosity to rise with time. If the ratio of isocyanate is reduced to counter this in the synthesis of the PAI then the amount of amide groups are reduced with an increase in the level of imide functionality which results in the solubility of the polymer being much reduced.

SUMMARY OF THE INVENTION

The present invention provides a liquid polyamideimide adhesive composition that can be applied to a substrate by screen printing (using stencil), dispensing, or by any other means whereby a liquid layer can be deposited. In particular, the invention provides the use of a liquid polyamineimide to form complete of partially imaged adhesives in the production of electrical components, especially flexible or rigid-flexible printed circuit boards. The adhesive compositions of the present invention advantageously comprise a polyamideimide having a terminal isocyanate group blocked by a thermally-dissociatable isocyanate-blocking group as a curable component. In one embodiment, the adhesive composition comprises a caproamide-modified polyamideimide and a further thermal-curing compound and/or a curing agent. The adhesive composition may optionally comprise a di- or higher-functional epoxy resin. The liquid adhesive composition advantageously also comprises one or more aprotic solvent, leveling aid, catalyst and filler. The liquid adhesive advantageously shows excellent viscosity stability prior to cure, plus outstanding solder resistance, X-hatch adhesion, pencil hardness, solvent resistance and/or flexibility after cure.

The liquid, thermal-curing, adhesive composition is advantageously suitable for use in the preparation of multilayer laminate materials, especially multilayer laminate materials for use in electronic components such as flexible and rigid-flexible printed circuit boards, displays, photovoltaic devices and membrane switches.

In a first aspect, the invention provides a liquid, thermal-curing, adhesive composition for a flexible printed circuit board substrate, comprising a polyamideimide having a terminal isocyanate group blocked by a thermally-dissociatable isocyanate-blocking group, wherein the composition is a liquid at 25° C. In a second aspect, the invention provides a liquid, thermal-curing, adhesive composition for a flexible printed circuit board substrate, comprising the reaction product of (i) a polyamideimide having a terminal isocyanate group and (ii) a thermally-dissociatable isocyanate-blocking agent, wherein the composition is a liquid at 25° C. Advantageously, the reaction product of the second aspect of the invention is a polyamideimide having a terminal isocyanate group blocked by a thermally-dissociatable isocyanate-blocking group of the first aspect of the invention. On heating the composition of the first or second aspects of the invention, the isocyanate-blocking group dissociates from the polyamideimide to reveal the terminal isocyanate group. The terminal isocyanate group is advantageously capable of participating in a thermal curing reaction to provide a cured adhesive.

In a third aspect, the invention provides a method of bonding two articles to one another comprising the steps of (a) providing a first article with the liquid, thermal-curing, adhesive composition of the invention, (b) contacting a second article with the applied adhesive composition, and then (c) curing the adhesive composition to bond the first and second articles to one another. Advantageously, the liquid, thermal-curing, adhesive composition used in the third aspect is the liquid, thermal-curing, adhesive composition of the first or second aspects of the invention. The step (a) may include the step of applying theliquid, thermal-curing, adhesive composition to the first article.

In a fourth aspect, the invention provides an electronic component, for example a flexible printed circuit board, comprising a cured adhesive of the invention, for example, a cured adhesive of the first or second aspects of the invention.

In a fifth aspect, the invention provides a two-pack system for use in preparing a thermal-curing adhesive composition of the invention, for example, a composition of the first or second aspects of the invention, said two-pack system comprising a first component which includes either a polyamideimide having a terminal isocyanate group blocked by a thermally-dissociatable isocyanate-blocking group or the reaction product of (i) a polyamideimide having a terminal isocyanate group and (ii) a thermally-dissociatable isocyanate-blocking agent; and a second component comprising a further thermally-curable and/or a thermal curing promoter. The further thermal-curing compound may be a hardener.

In a sixth aspect, the invention provides a method of preparing a liquid, thermal-curing, adhesive composition for a flexible printed circuit board, comprising the steps of (a) providing either a polyamideimide having a terminal isocyanate group blocked by a thermally-dissociatable isocyanate-blocking group or the reaction product of (i) a polyamideimide having a terminal isocyanate group and (ii) an isocyanate-blocking agent; and (b) combining the compound provided in step (a) with one or more of a filler, a thermal curing promoter, a stabiliser, a leveling aid and a further thermally-curable compound. Advantageously, the polyamideimide used in the method of the sixth aspect of the invention is as defined herein for any of the other aspects of the invention.

In a seventh aspect, the invention provides a method of preparing a liquid, thermal-curing, adhesive composition for a flexible printed circuit board, comprising the step of reacting (i) a polyamideimide having a terminal isocyanate group and (ii) an isocyanate-blocking agent and the step of combining the product thus obtained with one or more of a filler, a thermal curing promoter, a stabiliser, a leveling aid and a further thermally-curable compound to form the adhesive composition. Advantageously, the product of reacting (i) a polyamideimide having a terminal isocyanate group and (ii) an isocyanate-blocking agent is a liquid polyamideimide.

In an eighth aspect, the invention provides a liquid, thermal-curing adhesive composition comprising a polyamideimide, for use in the preparation of an electronic component, wherein the composition is a liquid at 25° C. and wherein the composition has a viscosity of less than 35 Pa·s at 25° C. after storage for three months at 15° C. The eighth aspect of the invention additionally or alternatively provides a thermal-curing adhesive composition comprising a polyamideimide, for use in the preparation of an electronic component, wherein the composition is a liquid at 25° C. and wherein there is no more than a 3.5-fold increase in the viscosity at 25° C. after storage for three months at 15° C. The adhesive compositions of the eighth aspect of the invention may, for example, be a composition according to the first or second aspects of the invention.

In a ninth aspect the invention provides the use of a polyamideimide as a component of liquid, thermal-curing, adhesive composition for the preparation of electronic components such as flexible or rigid-flexible printed circuit boards, displays, photovoltaic devices or membrane switches. The adhesive composition may, for example, be used in the preparation of multilayer laminate materials for use in electronic components. In a further aspect, the invention provides the use of a liquid polyamideimide, for example the liquid polyamideimide composition of the first or second aspects of the invention, to form complete or partially imaged adhesives in the production of electronic components, such as flexible or rigid-flexible printed circuit boards. In one embodiment the invention provides the use of a liquid polyamideimide to bond components in the production of flexible electronic components, such as flexible or rigid-flexible printed circuit boards, displays, photovoltaic devices or membrane switches.

The present invention advantageously gives an adhesive layer with excellent solder resistance, X-hatch adhesion, pencil hardness, solvent resistance and flexibility combined with good shelf-life. The liquid polyamideimide adhesives may, for example, be used in a variety of electronic applications for example printed circuit boards (PCBs), photovoltaics, displays and membrane switches. The use of liquid adhesives offers a much wider range of direct application possibilities than dry films and foils. Using liquid polyamideimide adhesives allows the material to be applied directly to the device by a wide range of commonly used application methods for depositing inks and coatings.

As well as offering process advantages in many electronic applications, liquid polyamideimide adhesives have also been found to have enhanced physical properties when compared to traditional adhesives, including very low water absorption (<0.1%). Adhesives based on polyamideimides resins have also been found to have high strength, exceptionally high heat resistance and broad chemical resistance once cured. When the polyamideimide adhesive is fully cured within, for an example, a flexible printed circuit board, there is no need to undergo a desmear process (where the acrylic or epoxy adhesive bleeds or spreads out during drilling or routing and needs to be removed prior to any final finishes being applied) as is common when using dry film adhesives. These properties allow liquid polyamideimides to be used as an adhesive in a wider range of electronic applications including photovoltaic's, membrane switches and displays, than is possible when using traditional adhesives.

The thermal curing adhesive advantageously also has excellent storage stability so that minimal rise in viscosity is seen. In particular, the use of polyamideimide in which the terminal isocyanate group(s) are blocked by a thermally-dissociatable isocyanate-blocking group, including amide-modified polyamideimide resins wherein the thermally-dissociatable isocyanate-blocking group is an amide, have been found give improved shelf life. In particular, the observed viscosity increases that are typical with polyamideimide-based formulations, are not generally witnessed when using the polyamideimides of the invention. The viscosity increase with polyamideimide resin formulations is due to some latent post reaction between residual isocyanate groups and acid groups on the resin. By blocking the isocyanate groups by reaction with an isocyanate-blocking group, the viscosity increase over time is reduced. After the thermally-curable composition is dried on the substrate, dissociation of the isocyanate-blocking group liberates the isocyanate group which can then cure with acid groups present in the resin.

The liquid, thermal-curing, adhesive compositions of the invention are useful for bonding together articles in electronic components, in particular electronic circuitry. In one embodiment, the articles are layers of flexible or rigid materials in a multilayer laminate. The multilayer laminate may, for example be the base board of a printed circuit board, such as a flexible or rigid-flexible printed circuit board. In another embodiment, one article is a base board and the other article is a stiffener member, a heat sink or other item for attachment to the base aboard. The liquid, thermal-curing, adhesive compositions of the invention are typically been found to be useful in bonding coverlays to flexible printed circuit boards. It has also been found that liquid, adhesive compositions of the invention can replace the traditional No Flow Prepeg compositions currently used to bond the flexible part of a rigid/flex circuit board to the rigid part(s). No flow prepregs are bonding layers designed for minimal resin flow and consistency during traditional lamination cycles (examples of these types of materials are VT-42PP, VT-45PP, VT47PP and VT-901PP from Ventec Electronics (Suzhou) Co Ltd). Advantageously, the flow of the adhesives of the invention can be controlled, for example by varying the temperature of a drying step. Following a high temperature drying step, for example of 100° C. or higher, to remove substantially all solvent, the adhesive has typically been found to behave like a no flow prepreg. However, with a lower temperature drying step, for example lower than 100° C., some solvent may remain and some flow of the adhesive layer during lamination can be observed. In one particularly useful embodiment, the liquid, adhesive compositions of the invention can function both as a coverlay layer to the flexible part of a rigid/flex circuit board, once cured, and can function as an adhesive to bond the flexible part to the rigid part of a rigid/flex circuit board. Thus, a single application of the liquid, adhesive compositions of the invention may advantageously replace the adhesive layer used to adhere a dry film coverlay to the flexible part of the circuit board, the dry film coverlay and the No Flow Prepreg. Therefore, the liquid adhesives of the present invention can allow the application of the a single layer that performs the functions previously performed by three separate layers in only one work cycle thus allowing for reduced processing cost. Also the need for only one press cycle for the total lay-up can reduce processing cost drastically by saving energy, manpower and time.

BREIF DESCRIPTION OF THE DRAWINGS

Figure 5:
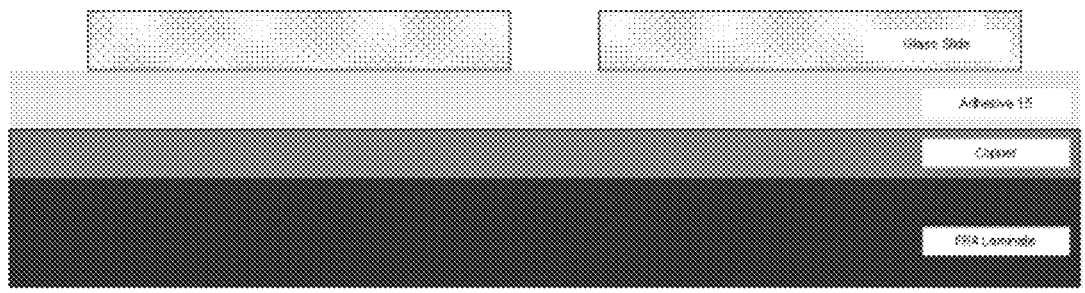

FIG. 5 showsside view of glass slides bondedashows a side view of glass slides bonded to a laminate material using an adhesive of the invention.

Figure 6:
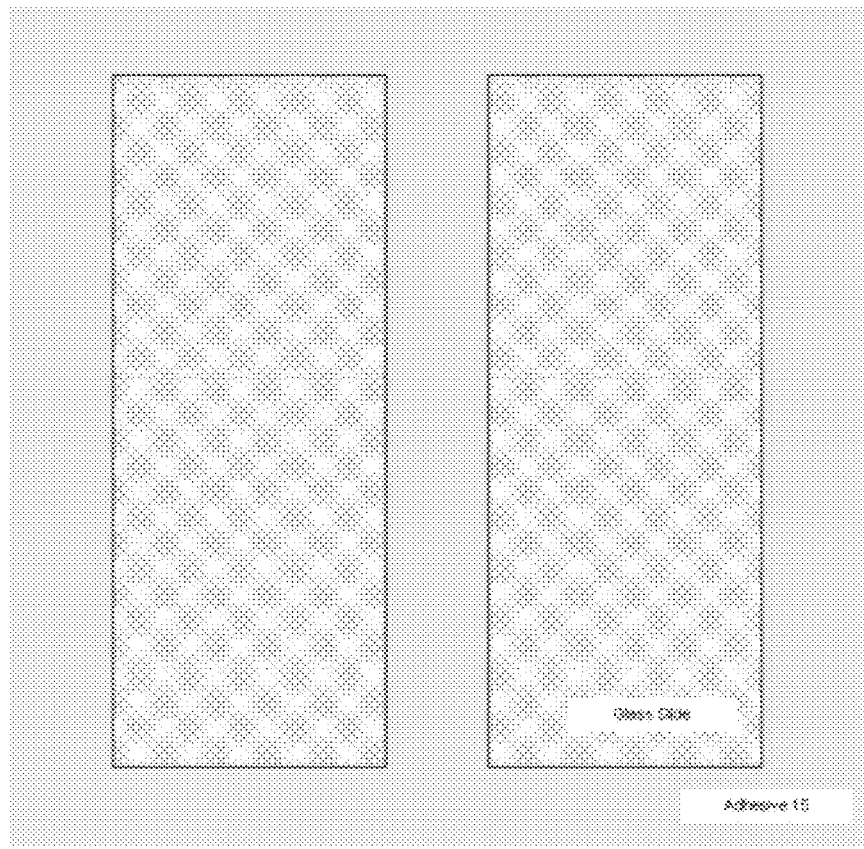

FIG. 6 shows a top view of glass slides bonded to a laminate material using an adhesive of the invention.

Figure 7:
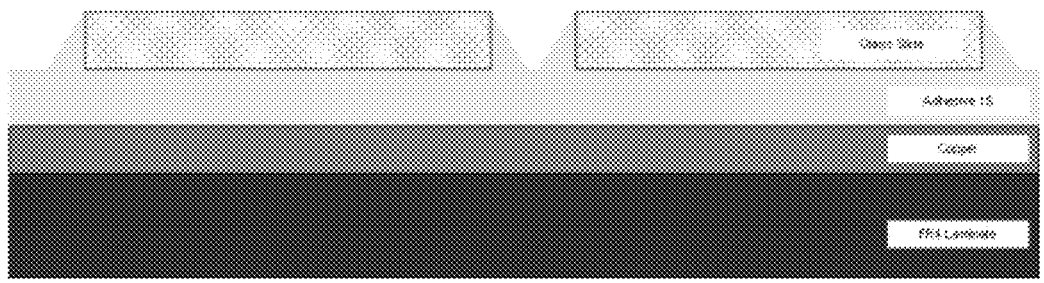

FIG. 7 shows a side view of glass slides bonded to a laminate material using an adhesive of the invention that is dried at a low temperature.

Figure 8:
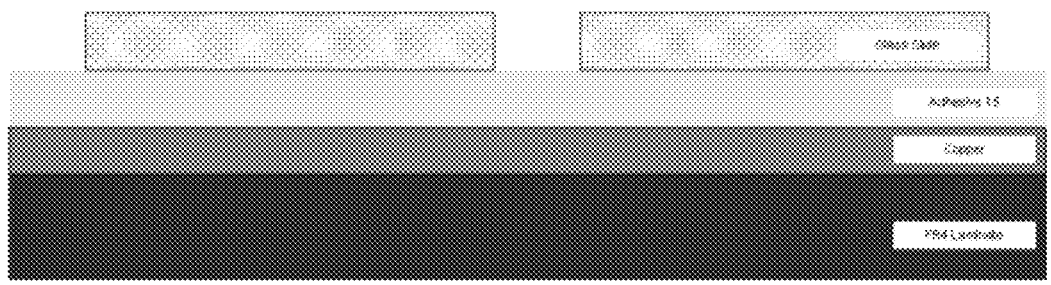

FIG. 8 shows a side view of glass slides bonded to a laminate material using an adhesive of the invention that is dried at a high temperature.

Figure 9:
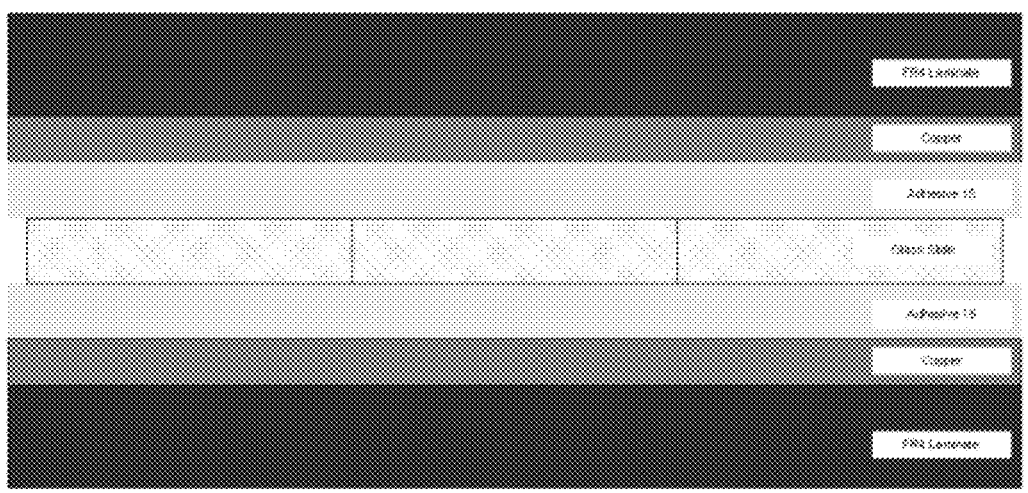

FIG. 9 shows a side view of laminate materials bonded to either side of glass slides using an adhesive of the invention.

Figure 10:
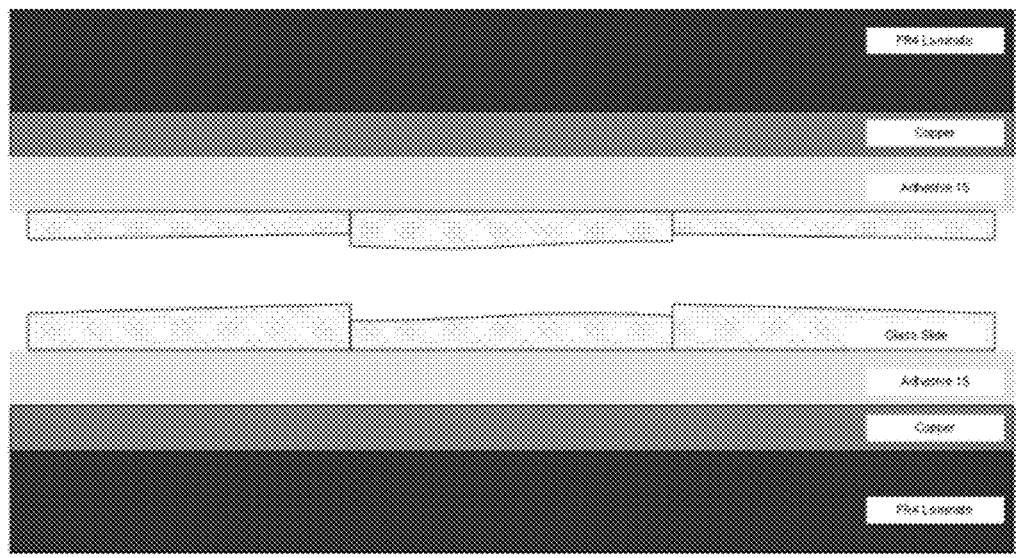

FIG. 10 shows a side view of the result of levering apart the laminate materials of FIG. 9.

Figure 11:
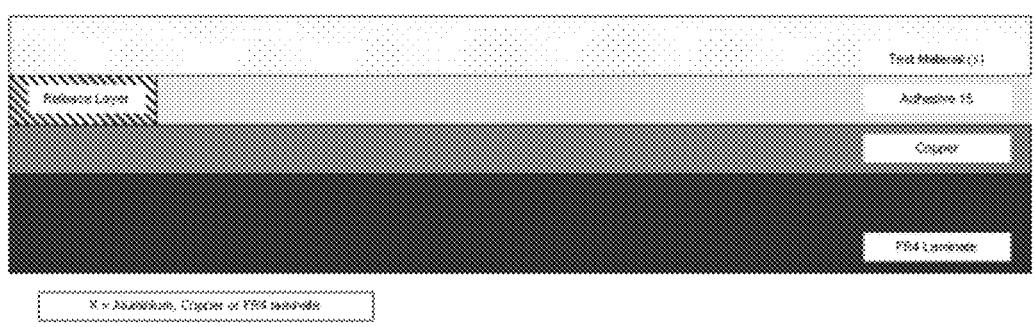

FIG. 11 shows a side view of a test set up in which as test layer is adhered to a laminate material using the adhesive of the invention.

Figure 12:
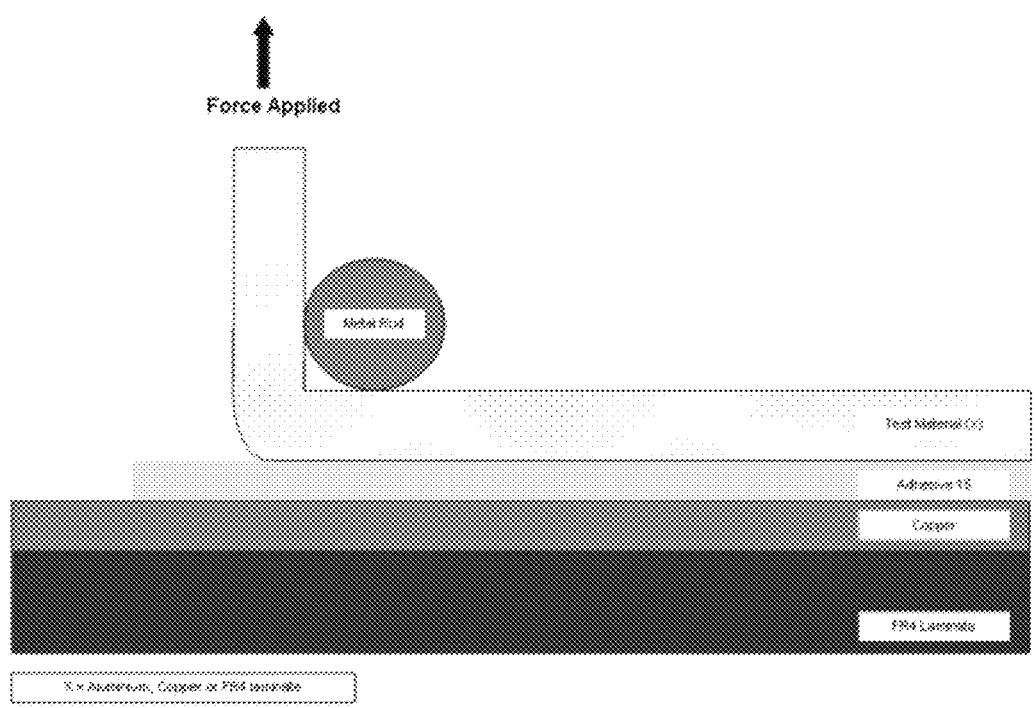

FIG. 12 shows a side view of the test set up of FIG. 11 during a test procedure.

DETAILED DESCRIPTION OF THE INVENTION

The present invention relates to a liquid adhesive composition for use in the preparation of electronic components, such as a flexible printed circuit board. The term "adhesive" as used herein refers to a substance that functions to bond two articles together. A layer of adhesive may perform one or more additional functions in addition to functioning to bond two articles together. For example, a layer of adhesive may have a dual function in both protecting an underlying substrate and bonding that underlying substrate to a further article. The term "for use on a flexible printed circuit board" and the like is, as is conventional, to be construed as "suitable for use on a flexible printed circuit board", and the skilled person would appreciate that the adhesive would be suitable for use in other electronic components including, in particular, other flexible electronic components such as rigid-flexible printed circuit boards, displays, photovoltaic devices or membrane switches. The term "liquid" as used herein refers to a substance that is liquid at 25° C. and standard atmospheric pressure. The terms "liquid adhesive", "liquid polyamideimide", "liquid polyamide adhesive" and the like as used herein refers to a composition that is a liquid at 25° C. and standard atmospheric pressure (one atmosphere), including liquid solutions and liquid melts.

The adhesive of the invention may, for example, be used as a laminating adhesive to bond substrate layers in a laminated article. The adhesive composition of the invention is advantageously suitable for use in bonding together layers in a metal-clad laminate material for use in an electronic component. In one embodiment, the composition is particularly suited for use as an adhesive, such as a laminating adhesive, in a flexible printed circuit board or a rigid-flexible printed circuit board. A flexible printed circuit board (FPC) is a metal clad laminate comprising a metal foil and a resin layer with good flexibility. A rigid-flexible printed circuit board includes a combination of flexible and rigid substrates laminated into a single article. In one embodiment, the adhesive of the invention is used to bond together the flexible and rigid parts of a rigid-flexible circuit board. Typically, rigid-flexible printed circuit boards include interconnecting flexible portions between rigid areas that allows the circuit board to be bent or folded into a three dimensional shape, for example, to replace multiple PCBs interconnected with connectors, wires and ribbon cables with a single article offering improved performance in confined spaces.

The term "polyamideimide" as used herein refers to polymers comprising repeating amidoimide units and thus may also be referred to as a poly(amidoimide). Polyamideimides are typically formed by reacting a diamine or diisocyanate with a carboxylic acid anhydride substituted with a carboxyl-containing functional group. The term "polyamideimide" will be used as general terms to include all polyamideimides including unmodified, modified (such as caproamide-modified polyamideimides) and photosensitive polyamideimides. Alternatively ways of forming a polyamideimide include reacting a diimide dicarboxylic acid with a diisocyanate or diamine as described in EP 2 070 961 A1.

In certain embodiments, the composition comprises a modified polyamideimide resin in which terminal isocyanate groups are blocked using an isocyanate blocking group. Such isocyanate blocking groups are known in the art and are described in, for example, *Adhesives and sealants: basic concepts and high tech bonding, Handbook of Adhesives and Sealants, Volume* 1, Philippe Cognard, Elesvier, 2005, 1$^{st}$ Edition, ISBN 0-08-044554-3 (particularly section 3.3.2.1 on pages 107-108). A "blocked isocyanate" being recognised in the art as an isocyanate that has been reacted with a blocking agent to prevent its reaction at room temperature with a function group in another molecule, such as an acid functional group, but which will dissociate or unblock at elevated temperatures to reveal the isocyanate group and allow further reaction, for example, with an acid functional group. On thermal dissociation of the isocyanate-blocking group, the isocyanate-blocking agent is typically regenerated. Advantageously, the isocyanate-blocking agent is volatile and evaporates from the composition. Various thermally-dissociatable isocyanate blocking agents are commercially available. For example, diethyl malonate, 3,5-dimethylpyrazole, methylethylketoxime and ∈-caprolactam are commercially available from Baxenden Chemicals Limited of Accrington, Lancashire, UK. An alternative term used in the art to describe a blocked isocyanate is a "capped isocyanate". The term "thermally-dissociatable isocyanate-blocking agent" refers to a compound that reacts with an isocyanate group form an isocyanate group blocked by a thermally-dissociatable isocyanate-blocking group. Thus, the "thermally-dissociatable isocyanate-blocking agent" is an isocyanate-blocking agent that is capable of thermally dissociating from a polyamideimide having a terminal isocyanate group. Isocyanate blocking agents typically include a group having a labile proton. Said group having a labile proton is advantageously a nucleophilic group capable of undergoing a nucleophilic addition reaction with an isocyanate group. Said isocyanate-blocking agents typically participate in a reaction in which the nitrogen atom of the isocyanate group is protonated and the blocking agent adds to the isocyanate to form a new bond between the nucleophilic site of the blocking agent and the carbon atom of the isocyanate. Typical isocyanate blocking agents include: alcohols, such as phenols and polyols; amines; amides, such as lactams; active methylene compounds with a labile methylene proton, such as malonates; nitrogen-containing heteroaryl compounds, such as pyrazoles; oximes; ketoximes, such as dialkyl ketoximes; and hydroxamic acid esters. The term "caproamide-modified polyamideimide" refers to the reaction product of a caproamide isocyanate blocking agent and a polyamideimide having a terminal isocyanate group, that is a polyamideimide with a thermally-dissociatable caproamide isocyanate-blocking group.

The term "carboxylic acid anhydride substituted with a carboxyl-containing functional group" as used herein refers to a compound having both a carboxylic acid functional group (or functional equivalent thereof, such as an acid chloride group), preferably a single carboxylic acid group, and an additional acid anhydride functional group, preferably a monoanhydride. Examples of such compounds are compounds of the formula (III) described in more detail below. Further examples include trimellic anhydride and cyclohexane tricarboxylic acid anhydride.

The term "aryl" as used herein refers to a $C_{6-12}$ monocyclic, bicyclic or tricyclic hydrocarbon ring, including fused ring systems, wherein at least one ring is aromatic.

The ratio of diisocyanate and a carboxylic acid anhydride substituted with a carboxyl-containing functional group used to prepare a polyamideimide is typically selected such that the majority of the reaction products include an unreacted isocyanate group and an unreacted carboxylic acid group, and, in particular, terminate with an unreacted isocyanate group and an unreacted carboxylic acid group. It is, of course, possible to prepare polyamideimides that predominantly include two unreacted isocyanate groups, for example a polyamideimide that terminates at both ends with an unreacted isocyanate group, by adjusting the proportions of isocyanate and carboxylic acid anhydride substituted with a carboxyl-containing functional group. An isocyanate-terminated polyamideimide in which the terminal-isocyanate group is blocked with an isocyanate blocking group is sometimes referred to in the art as a "capped-polyamideimide" or a "capped-polyamideimide resin".

In one embodiment of all aspects of the invention the polyamideimide is a thermoplastic amorphous polymer whose molecular structure is at least partly aromatic. Polyamideimides hold, as the name suggests, a positive synergy of properties from both polyamides and polyimides, such as high strength, melt processability, exceptional high heat capability, and broad chemical resistance.

In one embodiment of the composition of the first or second aspects of the invention, the polyamideimide having a terminal isocyanate group blocked by a thermally dissociateable isocyanate blocking group has the formula (I):

[B]—C(O)-[A]$_n$-OH  (I)

wherein: [A]$_n$ is a polyamideimide unit in which n is at least 4, for example at least 10; and [B] is a blocking group that is capable of thermally dissociating. In one embodiment, [B] is —N(R$^1$)—C(O)R$^2$, wherein either (a) R$^1$ is selected from H and $C_1$-$C_6$ alkyl, and R$^2$ is $C_1$-$C_6$ alkyl; or (b) R$^1$, R$^1$ and the amide group to which they are attached together from a 5 to 8-membered lactam ring, optionally substituted with one or more $C_1$-$C_4$ alkyl groups, for example 1 2 or 3 $C_1$-$C_4$ alkyl groups. In yet another embodiment, [B] is —N(R$^1$)—C(O)R$^2$, wherein either (a) R$^1$ and R$^2$ are each independently selected from $C_1$-$C_6$ alkyl; or (b) R$^1$, R$^1$ and the amide group to which they are attached together from a 5 to 8-membered lactam ring, optionally substituted with one or more $C_1$-$C_4$ alkyl groups, for example 1 2 or 3 $C_1$-$C_4$ alkyl groups. In a further embodiment, R$^1$, R$^1$ and the nitrogen atom and carbonyl group to which they are attached together forms a 5 to 8-membered lactam ring, optionally substituted with one or more methyl groups, for example 1 2 or 3 methyl groups.

In one embodiment, [B] is a group derived from a thermally-dissociable isocyanate-blocking agent. In a further embodiment, [BH] is a group derived from a compound of the formula [B]—H. In a further embodiment, the isocyanate-blocking agent of the second aspect of the invention and/or the compound of the formula [B]—H, is an isocyanate-blocking agent comprising a labile proton. In a further embodiment the thermally-dissociable isocyanate-blocking agent is an aliphatic amide. The aliphatic amide may, for example be straight chain, branched, or cyclic aliphatic amide. In one embodiment, the amide is optionally substituted with one or more groups selected from $C_{1-6}$ alkyl, $C_{1-6}$ alkoxy, halo and hydroxyl. In another embodiment, the amide is unsubstituted. In one aspect of the invention, the amide is a lactam. Suitable, lactams include γ-butyrolactam, δ-valerolactam and caprolactams, including ∈-caprolactam and δ-caprolactam. Preferably the amide is a caproamide (a $C_6$ amide comprising 6 carbon atoms in a chain or ring), such as a caprolactam. In one embodiment, the amine is ∈-caprolactam. In one embodiment the aliphatic amide is a 5 to 8-membered lactam, optionally substituted with one or more $C_1$-$C_4$ alkyl groups, for example, for example 1 2 or 3 $C_1$-$C_4$ alkyl groups. In one embodiment the alphatic amide is unsubstituted ∈-caprolactam.

Typically, the polyamideimide [A] comprises alternating units derived from a diisocyanate and from a carboxylic acid anhydride substituted with a carboxyl-containing functional group. The composition will typically include a mixture of polyamideimide moieties of differing chain lengths. Advantageously, at least 50 molar % of the polyamideimide molecules have at least four repeating amidoimide units (i.e. n is at least 4). In one embodiment, at least 50 molar % of the polyamideimide molecules are terminated at one end with an isocyanate, i.e. at least 50 molar % of the polyamideimide molecules have a structure that can be approximate as: . In an alternative embodiment, the composition may comprise a relatively high proposition of polyamideimide molecules that are terminated at both ends by an isocyanate group, for example at least 50 molar % of the polyamideimide molecules that comprise an isocyanate group, in combination with another molecular, either another polyamideimide or a different species, that includes at least one, preferably at least two, functional groups that are capable of reacting with an isocyanate group, such as a carboxylic acid functional group. In one embodiment, the composition comprises a mixture of a polyamideimide having a terminal isocyanate group blocked by a thermally-dissociatable isocyanate-blocking group at either end of the polyamideimide a further reactive component comprising two or more functional groups that are capable of reacting with an isocyanate group in a thermal curing reaction, such as a dicarboxylic acid, for example a polyamideimide having a terminal carboxylic acid group at ether end.

In one embodiment of the first and second aspects of the invention, the isocyanate-blocking group is thermally dissociatable at a temperature of at least 50° C., for example a temperature of at least 80° C., such as at least 100° C. In a further embodiment, the isocyanate-blocking group is thermally dissociatable at a temperature of at least 120° C., for example a temperature of at least 140° C., such as at least 150° C. In one embodiment the isocyanate-blocking group is thermally dissociatable at a temperature below 250° C., for example a temperature below 200° C. In one embodiment, the isocyanate-blocking group is thermally dissociatable at a temperature in the range of from 50° C. to 250° C., for example a temperature in the range of from 100° C. to 250° C., such as a temperature in the range of from 140° C. to 200° C. In one embodiment of the third aspect of the invention, the composition is heated to a temperature at which the isocyanate-blocking group thermally dissociates in or prior to the curing step, for example, to a temperature in the ranges specified above with respect to embodiments of the first and second aspects of the invention. In one embodiment, the composition is heated to a temperature of at least 120° C., for example at least 140° C., in or prior to the curing step of the third aspect of the invention. Isocyanate-blocking groups that are capable of dissociating at temperature of greater than 50° C. and especially at least 120° C. or higher, such as at least 140° C. have been found to advantageously provide a capped polyamideimide that is particularly resistant to increases in viscosity on storage. In one embodiment, the isocyanate-blocking groups are capable of dissociating at temperature below 250° C., for example below 220° C., especially below 200° C. The temperature range at which isocyanate-blocking groups formed using isocyanate-blocking agents thermally dissociate is known in the art as the "unblocking range". In one embodiment, the unblocking range of the blocking agent is within the ranges quoted above when used with an aromatic isocyanate. Slight variations in the unblocking range of an isocyanate-blocking group will be expected depending on the isocyanate moiety used. It is within the capability of the skilled person to select blocking agents that unblock within the temperature ranges quoted above and/or verify that the blocking agent selected unblocks within that range for a particular polyamideimide, for example by heating the blocked-polyamideimide until the blocking group dissociates. The unblocking range of commercially available isocyanate-blocking agents are commonly quoted in product specification details. For example, the product specification for isocyanate-blocking agents supplied by Baxenden Chemicals Limited quotes an unblocking range of 100-120° C. for diethyl malonate, 110-120° C. for 3,5-dimethylpyrazole, 140-160° C. for methylethylketoxime and 160-180° C. for ∈-caprolactam when used with an aliphatic isocyanate.

In one embodiment of the first or second aspects of the invention, the polyamideimide having a terminal isocyanate group is the reaction product of a diisocyanate and a carboxylic acid anhydride substituted with a carboxyl-containing functional group. The polyamideimide is advantageously terminated at one end with an isocyanate group and at the other end with a carboxylic acid group. The polyamideimide has at least four repeating amidoimide units, for example at least 10 repeating amidoimide units. In one embodiment the polyamideimide has no more than 100 repeating amidoimide units, for example no more than 60 repeating amidoimide units.

In one embodiment, the polyamideimide having a terminal isocyanate group is the reaction product of a diisocyanate and a carboxylic acid, wherein the diisocyanate has an isocyanate value of at least 420 mgKOH/g, for example greater than 445 mgKOH/g. It has been found when an isocyanate having an isocyanate value of at least 420 mgKOH/g, and especially greater than 445 mgKOH/g, is used a finished polymer is produced that exhibits an acceptable level of cracking on use. In one embodiment the diisocyanate is an aromatic diisocyanate or a partially aromatic diisocyanate. In a further embodiment, the diisocyanate is a compound of the formula (II):

OCN—[X]—NCO     (II)

wherein [X] is an aromatic linker group. The aromatic linker group is optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In another embodiment, the aromatic linker group is unsubstituted. In one aspect of the invention [X] comprises at least one aryl ring, for example, two aryl rings. In one embodiment, [X] is a divalent aryl radical. In one embodiment [X] comprises at least one phenyl ring. In one embodiment [X] is diphenylmethane. In one embodiment, —[X]— is -Ar$^1$-Z-Ar$^1$-, wherein Ar$^1$ and Ar$^2$ are each independently selected from aryl optionally substituted with one or more groups selected from halo, $C_1$-$C_4$alkyl, halo$C_1$-$C_4$alkyl, $C_1$-$C_4$alkoxy, halo$C_1$-$C_4$alkoxy, OH, oxo or carboxy$C_1$-$C_4$alkyl; and Z is selected from a carbon-carbon bond, $C_1$-$C_6$ branched or straight chain alkyl or —C(O)—. Suitable diisocyanates include diphenyl methane diisocyanate and 3,3'-dimethyl-4,4'-biphenyl diisocyanate. A mixture of more than one different diisocyanates may be used to prepare the imide for use in the compositions of the invention.

In one embodiment, the carboxylic acid anhydride substituted with a carboxyl-containing functional group is aromatic, for example, trimellitic acid anhydride (1,2,4-benzenetricarboxylic acid cyclic 1,2-anhydride). In an alternative embodiment the carboxylic acid anhydride substituted with a carboxyl-containing functional group is an aliphatic carboxylic acid anhydride, for example, cyclohexane tricarboxylic acid anhydride. In one embodiment, the carboxylic acid anhydride substituted with a carboxyl-containing functional group comprises an aryl ring optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In one embodiment, the aryl ring is a phenyl ring. In one embodiment, the carboxylic acid anhydride substituted with a carboxyl-containing functional group is a compound of the formula (III):

(III)

wherein [Y] is an aromatic or aliphatic group. In a further embodiment, [Y] is an aromatic group. In a yet further embodiment, [Y] comprises an aryl ring optionally substituted with one or more groups selected from $C_{1-6}$ alkyl, halogenated-$C_{1-6}$ alkyl, $C_{1-6}$ alkoxy, halogenated-$C_{1-6}$ alkoxy, halo and hydroxyl. In one embodiment, [Y] is a phenyl. In one embodiment, the carboxylic acid may be activated prior to the reaction with the isocyanate. For example, the carboxy groups may be converted to acid chloride groups. A mixture of more than one different carboxylic acid anhydride substituted with a carboxyl-containing functional groups may be used to prepare the imide of the invention.

In one embodiment of the first or second aspects of the invention, the polyamideimide having a terminal isocyanate group blocked by a thermally dissociateable isocyanate blocking group is a compound of the formula (Ia):

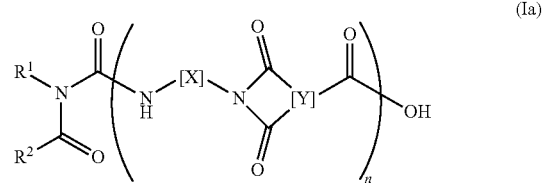

(Ia)

wherein n is at least 2; either $R^1$ and $R^2$ are each independently selected from $C_1$-$C_6$alkyl; or $R^1$, $R^1$ and the amide group to which they are attached together from a 5 to 8-membered lactam ring, optionally substituted with one or more $C_1$-$C_4$alkyl groups; [X] is an aromatic linker group as defined above for compounds of the formula (II) above; and [Y] an aromatic or aliphatic group as defined for compounds of the formula (III) above.

In a further embodiment, $R^1$ and $R^2$ together with the nitrogen atom and carbonyl group to which they are attached together from a lactam ring of the formula (IV):

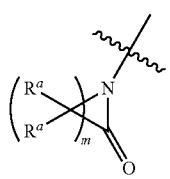

(IV)

wherein m is from 3 to 6; and each $R^a$ is independently selected from H and $C_1$-$C_4$alkyl. In one embodiment, all but one $R^a$ is H and the remaining $R^a$ is a $C_1$-$C_4$alkyl, for example methyl, ethyl or n-propyl, especially methyl. In another embodiment, each $R^a$ is H. In one embodiment m is 3 to 5, for example 3 or 4, especially 3.

In one embodiment of the first or second aspects of the invention, the adhesive composition is suitable for application by screen printing, roller coating, dip coating, curtain coating, spray coating, spin coating, ink jet, gravure coating, offset coating, flexo coating, dispensing, pad printing, brushing, flood coating or aerosol deposition. In a further embodiment the composition is suitable for application in a printing technique such as screen printing, offset printing or flexo printing, especially screen printing.

In one embodiment of the first or second aspects of the invention, the adhesive comprises an organic or inorganic filler. Suitable inorganic fillers include talc, barium sulfate, barium titanate, silica, alumina, clay, magnesium carbonate, calcium carbonate, aluminum hydroxide and silicate compounds. Suitable organic fillers include silicone resins, silicone rubber and fluorine resins. Inclusion of a filler and, in particular, an inorganic filler, is advantageous not only for the flow properties of the thermal-curing adhesive composition, but also for enhanced cohesion and hardness.

In one embodiment of the first or second aspects of the invention, the adhesive comprises a leveling aid. Leveling aids are substances used to eliminate unevenness of the film surface formed during printing and application. Suitable leveling agents include acrylic-based and silicone-based surfactants such as those supplied by Samuel Banner & Co Ltd under the trade name "FoamBlast". The leveling aid may additionally function as a defoaming agent to eliminate foam produced during printing, application and curing.

In one embodiment of the first or second aspects of the invention, the adhesive comprises a thermal curing promoter. The thermal curing promoter is a cure agent that promotes curing of the thermal curing components in the adhesive composition such as the unblocked isocyanate-terminated polyamideimide and any optional epoxy compounds present. Typically, thermal curing promoter are Lewis-base catalysts which promote curing reactions. Suitable thermal curing promoter include diamides, such as dicyandiamide, and imidazole derivatives (also known as blocked-imidazoles), such as azine imidazoles. Advantageously, the thermal curing promoter is activated on exposure to heat to produce a reactive species that promotes curing. The thermal curing promoter may, for example, be activated within the temperature ranges at which the thermally-dissociatable isocyanate-blocking group dissociates or at a higher temperature in a subsequent curing step. In one embodiment of the first or second aspects of the invention, the adhesive comprises a stabiliser. Suitable stabilisers include antioxidants and polymerisation inhibitors.

In one embodiment of the third aspect of the invention, the invention provides a method of bonding an article to a part-formed electronic component, for example a flexible or rigid/flexible printed circuit board, comprising the steps of (a) providing the part-formed electronic component with the thermal-curing adhesive composition of the first or second aspect of the invention, (b) contacting an article with the adhesive composition, and (c) curing the adhesive composition. In an alternative example, the method comprises the steps of (a) providing an article with the thermal-curing adhesive composition of the first or second aspect of the invention, (b) contacting a part-formed electronic component with the adhesive composition, and (c) curing the adhesive composition. In a further embodiment of the third aspect, the invention provides a method of preparing a flexible or rigid-flexible printed circuit board, display, photovoltaic device or membrane switch wherein the a part-formed electronic component is the part-formed flexible or rigid-flexible printed circuit board, display, photovoltaic device or membrane switch. In one embodiment, the article is a coverlay. In one embodiment, the part-formed electronic component is a metal-clad laminate. In another embodiment, the invention provides a method of preparing a rigid-flexible printed circuit board wherein the part-formed electronic component is a flexible or rigid part of the rigid-flexible printed circuit board and the article to be bonded to the part-formed electronic component is a rigid or a flexible part of the rigid-flexible printed circuit board respectively. Step (c) of the third aspect of the invention typically includes the step of heating the composition to a temperature of at least 100° C., for example at least 140° C., for example to dissociate the blocking agent. Step (c) may include a second heating step in which the composition is heated to a higher temperature than in the first heating step for example to cure the composition. The second heating step may, for example, involve heating the composition to a temperature of at least 160° C., for example of at least 200° C.

In one embodiment of the fourth aspect, the invention provides an electronic component comprising a cured adhesive comprising a polyamideimide wherein the adhesive bonds a coverlay to a metal-clad laminate substrate, such as a printed circuit board. In a further embodiment of the fourth aspect, the invention provides an electronic component comprising a cured adhesive comprising a polyamideimide wherein the adhesive bonds layers of a laminate material. In one embodiment the electronic component is a flexible or rigid-flexible printed circuit board, display, photovoltaic device or membrane switch. In another embodiment of the fourth aspect, the invention provides rigid-flexible printed circuit board comprising a cured adhesive comprising a polyamideimide wherein the adhesive bonds the rigid and flexible parts of the circuit board. In yet another embodiment of the fourth aspect, the invention provides rigid-flexible printed circuit board comprising a cured adhesive comprising a polyamideimide wherein the adhesive bonds the rigid and flexible parts of the circuit board and also functions as a coverlay for the flexible part of the rigid-flexible printed circuit board. Advantageously, the cured adhesive comprising a polyamideimide is the product of exposing a liquid adhesive composition comprising a polyamideimide to heat to thermally cure the composition. The liquid adhesive composition may, for example, be a composition according to the first, second or eighth aspect of the invention.

In one embodiment of the first and second aspect so the invention of the invention, the composition is provided as 1-pack system with all components of the adhesive composition provided in a single container. A single pack system has the advantage that it can be used as supplied.

In one embodiment of the fifth aspect of the invention, the first component is provided in a first container and the second component is provided in a second container. It has been found that enhanced thermal and mechanical properties can be obtained using a 2-pack system. In one embodiment of the fifth aspect of the invention, the second component comprises a thermal curing promoter that promotes curing on heating and a further thermal-curing compound.

The adhesive composition of the first, second or eighth aspects of the invention typically comprises a further thermal-curing compound in addition to the polyamideimide. The further thermal-curing compound may, for example, function as a hardener. When cured in conjunction with the polyamideimide, a hardener results in a cured substance which is harder and more durable then the cured polyamideimide alone. Hardeners are typically multifunctional compoiunds that contribute to an enhanced degree of cross-linking in the cured substance.

The adhesive composition of the first, second or eighth aspects of the invention, optionally comprises a epoxy resin, said epoxy resin advantageously being a thermal-curing compound. In one embodiment of the fifth or sixth aspects of the invention, the further thermal-curing compound is an epoxy resin. Advantageously, the epoxy resin is a multifunctional epoxy compound having two or more epoxy groups. Examples of multifunctional epoxy compounds include polyglycidyl ethers, such as polyglycidyl ethers obtained by reacting epichlorohydrin with polyhydric phenols (such as bisphenol A, novolac-type phenol resins, ortho-cresol novolac-type phenol resins) or polyhydric alcohols (such as 1,4-butanediol); or polyglycidyl esters obtained by reacting polybasic acids (such as phthalic acid, hexahydrophthalic acid) with epichlorohydrin, N-glycidyl derivatives of compounds having amine, amide or basic heterocyclic nitrogen atoms, or multifunctional alicyclic epoxy resins. Preferred epoxy resins include bisphenol epoxy resins and novolac epoxy resins. In one embodiment, the epoxy resins epoxy resin includes a phenolic, cresol, bisphenol or novolac group. In a further embodiment, the epoxy resins epoxy resin includes a phenolic, cresol or bisphenol-A group. In one embodiment, the composition comprises a combination of more than one epoxy resin. The epoxy resin content typically ranges from 0 to 40 wt % of the total composition, for example from 1 to 30 wt %, especially from 2 to 20 wt % of the total composition. In one embodiment, the epoxy resin content of the composition is at least 3 wt %, for example at least 5 wt % of the total composition. In the composition of the present invention, an epoxy resin, for example, a multifunctional epoxy novolac (either phenol or cresol based) may, optionally, be used to lower the cure temperature as well as giving greater hardness.

The liquid adhesive composition of the invention, for example, the composition of the first, second or eighth aspects of the invention or the two-pack system of the fifth aspect of the invention, optionally comprises one or more of a leveling aid, a stabiliser and a filler, for example a levelling aid and/or a filler. In a yet further embodiment, the composition or two-pack system, for example the first component of the two-pack system, optionally comprises an aprotic solvent.

In one embodiment, the liquid adhesive composition has a viscosity, for example an initial viscosity, of less than 35 Pa·s at 25° C., for example, less than 30 Pa·s at 25° C., especially less than less than 25 Pa·s at 25° C. The liquid adhesive composition may, for example, have an initial viscosity of less than 20 Pa·s at 25° C. in some embodiments. In a further embodiment, the composition has a viscosity of less than 35 Pa·s at 25° C. after storage for three months at 15° C., for example, a viscosity of less than 30 Pa·s at 25° C. after storage for three months at 15° C., especially a viscosity of less than less than 25 Pa·s at 25° C. after storage for three months at 15° C. In a further embodiment, the composition has no more than a 3.5-fold increase in the viscosity at 25° C. after storage for three months at 15° C., for example no more than a 3-fold increase in the viscosity at 25° C. after storage for three months at 15° C., especially no more than a 2.5-fold increase in the viscosity at 25° C. after storage for three months at 15° C. The liquid adhesive composition may, for example, have no more than a 2.0-fold increase in the viscosity at 25° C. after storage for three months at 15° C. in some embodiments. The liquid adhesive composition advantageously has a solids content of at least 20 wt %, for example at least 25 wt %, especially at least 30 wt %.

In one embodiment of the sixth aspect of the invention, the compound provided in step (a) is combined with a further thermally-curable compound in step (b). In one embodiment of the sixth aspect of the invention, the method comprises the further step of combining the polyamideimide having a terminal isocyanate group blocked by a thermally-dissociatable isocyanate-blocking group with one or more of a filler, a thermal curing promoter, a stabiliser or a leveling aid. In a further embodiment, the method optionally comprises comprises the further step of combining the polyamideimide having a terminal isocyanate group blocked by a thermally-dissociatable isocyanate-blocking group with an aprotic solvent. In a yet further embodiment, the method comprises the step of adjusting the viscosity of the adhesive composition so that it has a viscosity of less than 35 Pa·s at 25° C., for example, less than 30 Pa·s at 25° C., especially less than 25 Pa·s at 25° C.

In one embodiment, the method of the seventh aspect of the invention further comprises the step of preparing the polyamideimide having a terminal isocyanate group by reacting a diisocyanate and a carboxylic acid anhydride substituted with a carboxyl-containing functional group. Advantageously, the diisocyanate and the carboxylic acid anhydride substituted with a carboxyl-containing functional group are reacted in a molar ratio of diisocyanate to carboxylic acid anhydride substituted with a carboxyl-containing functional group of from approximately 10:8 to 10:12, for example from approximately 10:9 to 10:11, for example a ratio of approximately 1:1. In one embodiment, the diisocyanate and the carboxylic acid anhydride substituted with a carboxyl-containing functional group are reacted in the presence of the isocyanate-blocking agent. Advantageously, the molar ratio of the diisocyanate to the isocyanate-blocking agent is from approximately 10:0.1 to 10:10, for example from approximately 10:1 to 10:8, such as from approximately 10:1 to 10:5. In one embodiment the molar ratio of the diisocyanate to the isocyanate-blocking agent is from approximately 10:1 to 10:3. In an alternative embodiment the molar ratio of the diisocyanate to the isocyanate-blocking agent is from approximately 10:2 to 10:6. The level of blocking agent present in the reaction mixture can be used to control the molecular weight and/or polarity of the polyamideimide polymer. A relatively high proportion of blocking agent, for example at least a 10:1 ratio of diisocyanate to blocking agent, for example at least at 10:2 results in relative short polyamideimide polymers with greater polarity and hence solubility in polar solvents. In one embodiment, the polyamideimide polyamideimide having a terminal isocyanate group has a number average molecular weight of at least 5000, for example at least 10000, especially at least 20000. In a further embodiment the polyamideimide having a terminal isocyanate group has a number average molecular weight of no more than 60000, for example no more than 50000.

In one embodiment of the ninth aspect of the invention, there is provided the use of a liquid polyamideimide (including unmodified, modified or photosensitive polyamideimides) to form complete or partially imaged adhesive in the production of flexible or rigid-flexible printed circuit boards. The term "partially imaged adhesive" refers to an adhesive applied selectively to an area of a substrate where it is required, for example, using a printing technique to form a pre-defined image. In contrast a complete adhesive is applied across a substrate to form a complete coating of the adhesive.

Polyamideimides can be processed as liquids in a variety of ways: (1) if of low molecular weight, they can be processed as melts or in solution; after being applied onto a surface (e.g. coated or printed) they are dried and cured (i.e. further polymerized, to a high molecular weight solid film); (2) if of high molecular weight, they are processed in solution; following application, they are simply dried. The liquid adhesive compositions of the invention may, for example, include liquid polyamideimides and/or polyamideimides in solution. Advantageously, the liquid adhesive compositions of the first and second aspects of the invention include polyamideimides in solution in a suitable solvent. Suitable solvents include aprotic organic solvents, such as NEP. Preferably the liquid, thermal-curing polyamideimide adhesive composition of the invention is substantially free of protic solvents and in particular is substantially free of water.

Methods to deposit the liquid adhesive include virtually all forms of contact and non-contact printing, examples of which include but are not limited to screen printing; rotary screen printing; roller coating; dip coating; curtain coating; flood coating; spray coating (electrostatic and air); spin coating; inkjet; gravure; offset; flexo; dispensing; pad printing; brushing (including touching up damaged areas of finished film); inkjet; aerosol deposition; and any other means for depositing liquid inks, coatings or adhesives. By using traditional coating methods as described above to apply liquid polyamideimide adhesives, many advantages can be realized when compared to the traditional process of applying dry films. Dry films have high costs associated due to both material consumption and man-hours required during application. Liquid adhesives reduce these costs by reducing material wastage (adhesive is only applied where needed) and eliminating the need for manual cutting/placing of dry film adhesives which is a labor intensive process. Due to the necessary manual positioning of dry film polyimide adhesives, the minimum definition which can be achieved is typically about >0.8 mm. Far greater resolution can be achieved by using liquid adhesives in conjunction with the aforementioned printing techniques, where the definition is governed by the chosen method of application rather than limited by the dry film coverlay. Dry film polyimide adhesives are supplied in standard thicknesses, usually 25 or 50 microns. As the liquid adhesives can be applied directly, application thickness can be controlled to give a processed film of the desired thickness. Other advantages offered by liquid adhesives include the elimination of any desmear processes following drilling/routing.

The application of liquid adhesives is advantageous for application selected areas, where holes are already drilled and thus no drilling of the adhesive layer is required eliminating the potential for the formation of smear, which otherwise would need to be removed after drilling the adhesive. After application, the liquid adhesive would preferably be capable of being electroplated with no negative effects such, as loss of adhesion (which can be shown by performing thermal shock tests at elevated temperature, e.g. 288° C. for 30 seconds), thus the difficulties related to desmear can be eliminated.

In addition to offering process advantages in many electronic applications, liquid adhesives also have enhanced physical properties when compared to traditional dry film polyimides, such as low water absorbance (<0.1%). This allows adhesives comprising liquid polyamideimides to be used in a wider range of electronic applications where low water absorption is a key characteristic, for example membrane switches and displays, and photovoltaic modules, where a highly weatherable dielectric coating can be applied to traditional materials such as polyvinylfluoride (PVF) backsheets.

Utilizing existing established process equipment for the application of liquid polyamideimides eliminates the requirement for any significant capital investment in order to process these materials, with the process parameters falling well within current capabilities. The liquid polyamideimides can be easily adapted to produce inks of the necessary viscosity and rheology to suit the intended application.

In one embodiment of the ninth aspect of the invention, there is provided the application of liquid polyamideimide (including modified polyamideimides) by the use of screen printing technology of any kind. In another embodiment, there is provided the application of liquid polyamideimide (including modified polyamideimides) by the use of roller coating technology. In another embodiment, there is provided the application of liquid polyamideimide (including modified polyamideimides) by the use of dip coating technology. In another embodiment, there is provided the application of liquid polyamideimide (including modified polyamideimides) by the use of curtain coating technology. In another embodiment, there is provided the application of liquid polyamideimide (including modified polyamideimides) by the use of spray coating technology (electrostatic and air). In another embodiment, there is provided the application of liquid polyamideimide (including modified polyamideimides) by the use of spin coating technology. In another embodiment, there is provided the application of liquid polyamideimide (including modified polyamideimides) by the use of ink jet technology. In another embodiment, there is provided the application of liquid polyamideimide (including modified polyamideimides) by the use of gravure coating technology. In another embodiment, there is provided the application of liquid polyamideimide (including modified polyamideimides) by the use of offset coating technology. In another embodiment, there is provided the application of liquid polyamideimide (including modified polyamideimides) by the use of flexo coating technology. In another embodiment, there is provided the application of liquid polyamideimide (including modified polyamideimides) by the use of dispensing technology. In another embodiment, there is provided the application of liquid polyamideimide (including modified polyamideimides) by the use of pad printing technology. In another embodiment, there is provided the application of liquid polyamideimide (including modified polyamideimides) by the use of brushing (including touching up damaged areas of finished film). In another embodiment, there is provided the application of liquid polyamideimide (including modified polyamideimides) by the use of flood coating technology. In another embodiment, there is provided the application of liquid polyamideimide (including modified polyamideimides) by the use of aerosol deposition technology.

The following description illustrates how the inventive use of liquid adhesives can eliminate costly work and press cycles compared to the use of dry foils.

In the case of a combination of a rigid panel with a flexible panel to give a rigid-flexible circuit board, the flexible part with copper tracks and pads on the outer sides has to be protected by coverlay foil. Using a conventional dry film adhesive, a sheet of adhesive needs to be added to a copper layer and then a solid coverlay foil needs to be pressed onto the adhesive layer in a press cycle to give good adhesion. This is a press cycle which lasts about 2-3 hours and needs high energy as temperatures needed are typically 180-185° C. In contrast, the liquid adhesive of the invention can be applied (for example by screen printing, etc), the coverlay added and the adhesive dried in an oven at 150° C. This applies to full area application (liquid adhesive and coverlay foil is being applied over full area of panel) as well as for selected area application. Once all layers of the rigid-flexible layup are complete, they can all be bonded using only one typical press cycle, rather than requiring a separate press-cycle for each layer as is necessary for dry film adhesives.

The use of liquid adhesives in some embodiments of the invention has been found to offers the following advantages over traditional dry film polyimide technology:

Shorter production times.

Significant cost reduction through effective material consumption—full area or partial printing possible.

Apply different thicknesses from a minimum of about 5-10 microns up to desired thickness.

Thinner construction means higher flexibility, saving space and weight.

Further cost savings realized through reduced man hours.

Energy costs also considerably reduced.

Improved FPY (First Pass Yield) through improved process stability. FPY is the percentage of a successfully produced series of panels (e.g. if 100 panels had to be produced and 90 panels pass the Q-inspection, the FPY is 90%). Improved process stability leads to higher FPY and so to savings.

Wide process window in terms of both pre-dry (tack-dry) conditions and final cure (post-bake), which can also be incorporated into existing lamination cycles.

Better coverage of tight track configurations and high copper heights.

Reduced environmental impact (from production of foils at supplier to usage).

Easier logistics and stock keeping as lower number of materials and less space needed.

Product conforms to health & safety regulations (e.g. RoHS), no mutagenic or carcinogenic materials used.

Liquid polyamideimide adhesives may also offer a wide process window in terms of:

Pre-dry (tack-dry) conditions (minimum of 30 minutes at 80° C.), note when pre-dried at 120° C. it acts as a no flow prepeg.

Final cure (post-bake) minimum of 30 minutes at 150° C.

Lamination step—it also be incorporated into existing lamination cycles (minimum of 160° C., with a minimum time of 60 minutes and a minimum pressure of 20 bar).

There now follows a description of how an example of the polyamideimide having a terminal isocyanate group blocked by a thermally dissociateable isocyanate blocking group for use in the compositions of the invention may be prepared. The skilled person would appreciate that this is one of a number of routes that could be used to prepare a polyamideimide having a terminal isocyanate group blocked by a thermally dissociateable isocyanate blocking group and the example route described below should not be construed as limiting. In a first stage an imide (V) is produced in an imidisation reaction in which a carboxylic acid anhydride substituted with a carboxyl-containing functional group (III) is reacted with a diisocyanate (II); this is represented in Scheme 1 below.

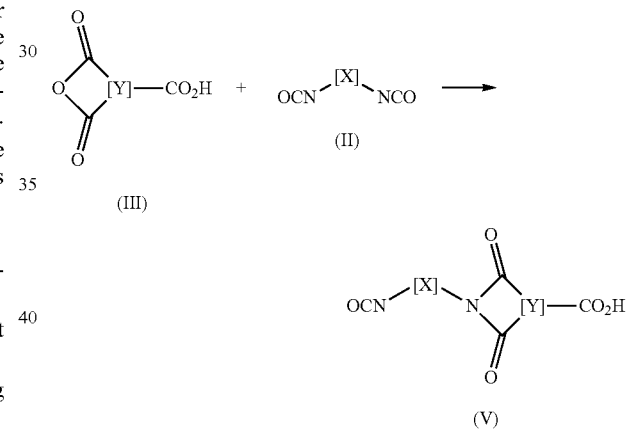

In each of Formulae (II), (III) and (V) above, each of [X] and [Y] are as defined above. The imidisation reaction is typically conducted at a temperature of between 75-90° C. and the best results are obtained by reacting equimolar ratios of diisocyanate with a carboxylic anhydride. If an excess of carboxylic anhydride is used then the imide content is increased while with an excess of diisocyanate the imide content is reduced.

Once the imide is produced then the temperature is increased and the polymerisation reaction proceeds. In the presence of an isocyanate-blocking agent [B]—H which has a labile proton, such as ∈-caprolactam, some reaction with isocyante functional groups in will occur resulting in the formation of blocked isocyanate groups in the polyamideimide having a terminal isocyanate group blocked by a thermally dissociateable isocyanate blocking group as illustrated in Scheme 2 below. The isocyanate blocking groups prevent further reaction of the isocyante groups which will limit the increase in viscosity of the polymer once the synthesis is complete.

Scheme 2

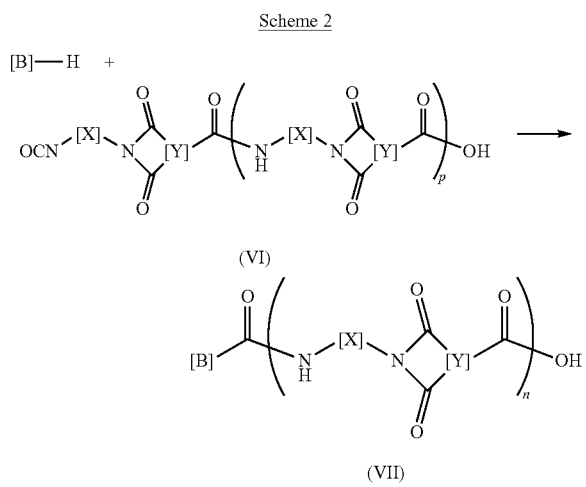

In each of Formulae (VI) and (VII) above, each of [X] and [Y] are as defined above, n at least 4 and p is n−1. Once the composition is dried on the circuit board, the isocyanate-blocking group will dissociate at elevated temperature, such as temperatures greater than 150° C. for a caproamide group to reveal the isocyanate group in a reverse of the reaction shown in scheme 2. Typically isocyanate-blocking agent is regenerated and evaporates. The isocyanate group can then polymerise with the carboxylic acid groups in the normal way in a curing reaction.

The skilled person will appreciate that the above is a simplified description of the reaction to produce the polyamideimide having a terminal isocyanate group blocked by a thermally dissociateable isocyanate blocking group for use in the composition of the invention and other mechanisms can occur. For example the isocyanate blocking agent may react with some molecules of the diisocycanate (II) prior to the imidiasation reaction and/or the isocyanate blocking agent may react with the imide (V) prior to polymerisation to form the polyimide (VI).

EXAMPLES

The invention will now be illustrated in the following specific examples. These examples should not be construed as limiting.

Adhesive Formulations

Resin 1

525 g of N-methylpyrrolidone was charged to a 1 liter flask fitted with a stirrer. 153 g of diphenylmethane diisocyanate with a purity of >99% was added. 122 g of trimellitic anhydride with an anhydride content of >99% and 8 g ∈-caprolactam are then added to the reactor. The reactor is then set to total reflux and slowly heated to 75° C., once at 75° C. the heat was switched off and the temperature was allowed to exotherm to 90° C. Once the evolution of carbon dioxide was complete and the imide content was >95%, the temperature was raised to 125° C. and held until the viscosity rose to between 2500-3500 mPas at 15° C. Once this viscosity has been reached, then the temperature was reduced to 90° C. and the product was discharged via a 50 micron filter.

Resin 1 had a non volatile content of 34%, acid value 84 mgKOH/g, viscosity 28000 mPas at 15° C. and showed no cracking with a 12 micron crease test on the dried polymer.

Resin 2

525 g of N-methylpyrrolidone was charges to a 1 liter flask fitted with a stirrer. 153 g of diphenylmethane diisocyanate with a purity of >99% was added to the reactor followed by 122 g of trimellitic anhydride with an anhydride content of >99% and 25 g of ∈-caprolactam. The reactor was then set to total reflux and slowly heated to 75° C., once at 75° C. the heat was switched off and the temperature was allowed to exotherm to 90° C. Once the evolution of carbon dioxide was complete the imide content was >95%, at this point the temperature was raised to 125° C. and held until the viscosity rose to between 2000-3000 mPas at 15° C. Once this viscosity had been reached, then the temperature was reduced to 90° C. and the product was discharged via a 50 micron filter.

Resin 1 had a non-volatile content of 32%, an acid value of 88 mgKOH/g, a viscosity of 24000 mPas at 15° C. and showed no cracking with a 12 micron crease test on the dried polymer.

Comparative Resin 525 g of N-methylpyrrolidone was charged to a 1 liter flask fitted with a stirrer. 153 g of diphenylmethane diisocyanate with a purity of >99% was added to the reactor followed by 122 g of trimellitic anhydride with an anhydride content of >99%. The reactor was then set to total reflux and slowly heated to 75° C., once at 75° C. the heat was switched off and the temperature was allowed to exotherm to 90° C. Once the evolution of carbon dioxide was complete and the imide content was be >95%, the temperature was raised to 125° C. and held until the viscosity rose to between 2500-3500 mPas at 15° C. Once this viscosity had been reached, then the temperature was reduced to 90° C. and discharged via a 50 micron filter.

Comparative Resin had a non volatile content of 35%, an acid value of 85 mgKOH/g, a viscosity of 27000 mPas at 15° C. and showed no cracking with a 12 micron crease test on the dried polymer.

Viscosity Stability at 15° C.

| Time Frame | Viscosity* Resin 1 | Viscosity* Resin 2 | Viscosity* Comparative Resin |
|---|---|---|---|
| Initial | 28000 mPas | 24000 mPas | 27000 mPas |
| 1 Month | 29000 mPas | 24500 mPas | 30000 mPas |
| 2 Months | 32500 mPas | 26000 mPas | 37500 mPas |
| 3 Months | 36000 mPas | 28500 mPas | 49000 mPas |
| % increase (3 months) | 28.6% | 18.8% | 81.5% |

*Viscosities were tested using a cone and plate Anton Paar Physica MCR 101 @15° C., 25 mm cone @ 50 s$^{-1}$ Resins 1, 2 and Comparative Resin were formulated into adhesives following the manufacturing method shown below:
1. Weigh out resin(s) into container
2. Mix on Dispermat with flat blade until pot is warm to touch (~3 minutes)
3. Weigh in foamblast, DICY & 2MZ-Azine
4. Mix again until smooth appearance (no powder lumps ~2 minutes)
5. Weigh in Viatalc VT10 and hand stir until wetted out
6. Mix on Dispermat (~1 minute)
7. Weigh in Aerosil R974 silica and hand stir until all powder is wetted out
8. Mix on dispermat until smooth (~3 minutes)
9. Check dispersion on grind gauge (spec ≤5 μm)

The following adhesive formulations were evaluated:
Inventive Adhesives 1-14:

| Material | 1 | 2 | 3 | 4 | 5 | 6 | 7 |
|---|---|---|---|---|---|---|---|
| Inventive Resin 1 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |

| Material | 8 | 9 | 10 | 11 | 12 | 13 | 14 |
|---|---|---|---|---|---|---|---|
| Inventive Resin 2 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |

Comparative Adhesives 1-7

| Material | C1 | C2 | C3 | C4 | C5 | C6 | C7 |
|---|---|---|---|---|---|---|---|
| Comparative Resin 1 | 91.00 | 82.50 | 86.54 | 75.26 | 82.38 | 74.28 | 81.80 |
| Epoxy resin 1 - Epikote 828 BPADGE (100%)[1] | — | 8.50 | 4.46 | — | — | — | — |
| Epoxy resin 2 - Epiclon N673 ECN (68.76%)[2] | — | — | — | 15.74 | 8.62 | — | — |
| Epoxy resin 3 - DEN438 EPN (76.77%)[3] | — | — | — | — | — | 16.72 | 9.20 |
| Leveling aid - Foamblast UVD[4] | 1.00 | 1.00 | 1.00 | 1.00 | 1.00 | 1.00 | 1.00 |
| Cure Agent 1 - Omicure DDA5 Dicy[5] | 0.50 | 0.50 | 0.50 | 0.50 | 0.50 | 0.50 | 0.50 |
| Cure Agent 2 - Curezol 2MZ-Azine[6] | 0.50 | 0.50 | 0.50 | 0.50 | 0.50 | 0.50 | 0.50 |
| Filler 1 - Viatalc VT10 Talc[7] | 5.00 | 5.00 | 5.00 | 5.00 | 5.00 | 5.00 | 5.00 |
| Filler 2 - Aerosil R974 Silica[8] | 2.00 | 2.00 | 2.00 | 2.00 | 2.00 | 2.00 | 2.00 |
| Total | 100 | 100 | 100 | 100 | 100 | 100 | 100 |

[1]Euro Resins UK Ltd
[2]DIC Europe
[3]Univar Ltd
[4]Samuel Banner & Co Ltd
[5]Hubron Speciality Ltd
[6]Lansdowne Chemicals PLC
[7]Viaton Industries Ltd
[8]Evonik Degussa GmbH Application of Adhesives by Screen Printing:
  Mesh used: 43 T/cm polyester block
  10 mm screen snap off height
  65/70 shore squeegee used
  Panel racked vertically for 10 min. @ Room Temp before 150° C. bake Other screens can be used depending on required dry film thickness. The addition of solvent would lead to other application methods such as spray coating, curtain coating, roller coating, pad printing, gravure, flexo, offset, ink jet and spin coating.

Panel Details:
  1 oz. double-sided plain copper clad FR4 panels from Lamar Group Ltd.
  0.5 oz. single-sided copper polyimide IPCB25A design flexible laminate from Juniper Print Test Methods
Solder Resistance
  Equipment required:
  Alpha 857 flux
  Solder bath @260° C.
  Timer
  Method:
  Flux each panel with Alpha 857 flux.
  Then dip the panel into the solder and start a 10 second timer.
  When the timer beeps, withdraw the panel and cool using water.
  Film should show no removal, blistering, cracking or flaking after test.

Figures 1, 2:
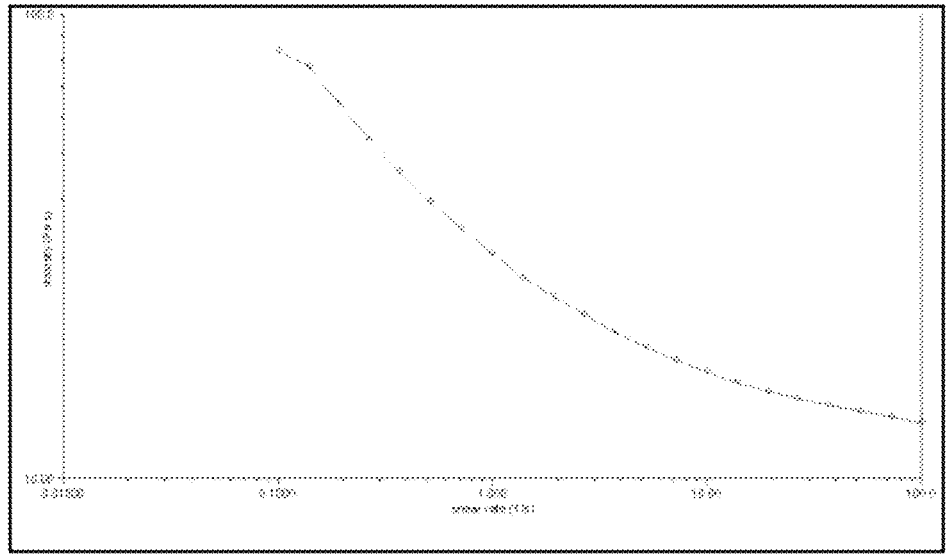
FIG. 1 shows a rheogram of a screen printed adhesive produced with TA Instruments AR2000ex control stress rheometer, 4 cm 2° cone, shear rate from 0.1 $s^{-1}$ to 100 $s^{-1}$ @25 ° C. over 22 steps.
FIG. 2 shows in Table 1 the classification of the X-hatch Resistance test results.

Gloss
  Equipment required:
  Panel for testing
  Sheen mini gloss 101N 60° gloss meter
  Calculator
  Method:
  Measure 5 areas of each panel using the gloss meter and take an average.
X-hatch Resistance
  Equipment required:
  Gitterschnit Cross-hatch cutter—consisting of 6 parallel blades with ~2 mm gaps
  Tape—pressure sensitive tape 3M Scotch tape brand 600 or its equivalent (e.g. branded Sellotape).
  Method:
  Use the prescribed cutting tool to cross-hatch (at 90° angles) an area.
  Make all cuts 25 mm long.
  Use sufficient pressure to cut through the coating material.
  Lightly brush the cross-hatched area with a soft brush to remove any particles of coating material.
  Press a strip of pressure sensitive tape 12.5 mm wide by 50 mm long firmly across the surface of the cross hatched area using a hand roller or eraser.
  Rapidly remove the tape by manual force applied approximately perpendicular to the pattern.
  An unused strip of tape shall be used for each test, which comprises a single pull off.
  Visually examine the tape for evidence of coating material particles.
  Examine for separation, fracturing, or delamination of the coating from the surfaces of the bare material. Very fine transfer, e.g. from the cut edges, shall be ignored.
  Using the numbering system of 0-5 as indicated in Table 1, assess and report the degree of adhesion.
  The classification of the test results are shown in FIG. 2 (Table 1).
Pencil Hardness
  Equipment required:
  Sheen Pencil hardness trolley 720
  Pencils graded H-9H
  Pencil sharpener
  Abrasive paper
  Method:
  Using a pencil sharpener, sharpen the pencil to a fine point. Hold the point of the pencil at 90° to coarse paper and using a circular hand motion grind down the point until it gives a flat end of 1.5 mm diameter.
  Place the coated panel on a firm level, horizontal surface. Starting with the hardest grade of pencil, place the hardness trolley on a hard flat surface with the wheels in the air, place the pencil in the hole and allow hold the pencil to run through until it reaches the surface, gently tighten the screw to secure the pencil in place. Turn the trolley over and with the lead against the test panel surface on a flat level surface (trolley wheels and pencil lead). Exert sufficient uniform forward (but NOT downwards) force to move the trolley ~20 mm.
  Inspect the track for either gouges or cuts, if they are seen repeat the above with a softer pencil, record the lowest pencil the film has achieved. Pass is ≥6H
Solvent Resistance
  Equipment required:
  Pot of Dichloromethane
  Timer
  Method:
  Place a piece of each panel into the pot of dichloromethane and start a 1 hour timer, remove panel after this time and inspect. Film should show no signs of removal.
Flexibility/Crease Test
  Equipment required:
  ×10 eye glass
  Timer
  Method:
  Fold the copper/polyimide substrate in half (adhesive side in) and apply pressure to the fold area using a 3 kg weight for ~1 minute
  Open flat and examine the crease using the ×10
  Report any cracks as a fail
Print Test Results
  Cure conditions in the following tables are quoted as X minutes are 150° C. followed by Y minutes at 180° C.

| Adhesive | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| 1 | 60, 70 | Pass | 37.3 | 43.4 | Pass GT0 | Pass | Pass | Pass |
|   | 120, 70 | Pass | 47.3 | 44.4 | Pass GT0 | Pass | Pass | Pass |
|   | 180, 70 | Pass | 45.3 | 38.6 | Pass GT0 | Pass | Pass | Pass |
| 2 | 60, 70 | Pass | 47.3 | 48.7 | Pass GT0 | Pass | Pass | Pass |
|   | 120, 70 | Pass | 47.9 | 48.1 | Pass GT0 | Pass | Pass | Pass |
|   | 180, 70 | Pass | 45.7 | 44.9 | Pass GT0 | Pass | Pass | Pass |
| 3 | 60, 70 | Pass | 44.8 | 43.6 | Pass GT0 | Pass | Pass | Pass |
|   | 120, 70 | Pass | 49.7 | 43.1 | Pass GT0 | Pass | Pass | Pass |
|   | 180, 70 | Pass | 50.0 | 45.0 | Pass GT0 | Pass | Pass | Pass |
| 4 | 60, 70 | Pass | 48.5 | 48.6 | Pass GT0 | Pass | Pass | Pass |
|   | 120, 70 | Pass | 50.8 | 51.6 | Pass GT0 | Pass | Pass | Pass |

-continued

| Adhesive | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| | 180, 70 | Pass | 50.3 | 49.7 | Pass GT0 | Pass | Pass | Pass |
| 5 | 60, 70 | Pass | 37.6 | 37.8 | Pass GT0 | Pass | Pass | Pass |
| | 120, 70 | Pass | 44.7 | 41.8 | Pass GT0 | Pass | Pass | Pass |
| | 180, 70 | Pass | 43.3 | 40.2 | Pass GT0 | Pass | Pass | Pass |
| 6 | 60, 70 | Pass | 57.8 | 63.9 | Pass GT0 | Pass | Pass | Pass |
| | 120, 70 | Pass | 59.1 | 63.9 | Pass GT0 | Pass | Pass | Pass |
| | 180, 70 | Pass | 58.9 | 61.5 | Pass GT0 | Pass | Pass | Pass |
| 7 | 60, 70 | Pass | 55.5 | 53.7 | Pass GT0 | Pass | Pass | Pass |
| | 120, 70 | Pass | 59.8 | 58.0 | Pass GT0 | Pass | Pass | Pass |
| | 180, 70 | Pass | 56.6 | 56.7 | Pass GT0 | Pass | Pass | Pass |
| 8 | 60, 70 | Pass | 34.3 | 45.5 | Pass GT0 | Pass | Pass | Pass |
| | 120, 70 | Pass | 43.4 | 45.8 | Pass GT0 | Pass | Pass | Pass |
| | 180, 70 | Pass | 40.9 | 37.1 | Pass GT0 | Pass | Pass | Pass |
| 9 | 60, 70 | Pass | 47.3 | 48.7 | Pass GT0 | Pass | Pass | Pass |
| | 120, 70 | Pass | 43.8 | 50.1 | Pass GT0 | Pass | Pass | Pass |
| | 180, 70 | Pass | 42.2 | 46.5 | Pass GT0 | Pass | Pass | Pass |
| 10 | 60, 70 | Pass | 42.1 | 42.9 | Pass GT0 | Pass | Pass | Pass |
| | 120, 70 | Pass | 54.3 | 44.7 | Pass GT0 | Pass | Pass | Pass |
| | 180, 70 | Pass | 50.7 | 46.9 | Pass GT0 | Pass | Pass | Pass |
| 11 | 60, 70 | Pass | 48.8 | 45.8 | Pass GT0 | Pass | Pass | Pass |
| | 120, 70 | Pass | 47.8 | 50.9 | Pass GT0 | Pass | Pass | Pass |
| | 180, 70 | Pass | 46.4 | 47.8 | Pass GT0 | Pass | Pass | Pass |
| 12 | 60, 70 | Pass | 36.9 | 36.4 | Pass GT0 | Pass | Pass | Pass |
| | 120, 70 | Pass | 46.1 | 43.8 | Pass GT0 | Pass | Pass | Pass |
| | 180, 70 | Pass | 44.3 | 40.2 | Pass GT0 | Pass | Pass | Pass |
| 13 | 60, 70 | Pass | 56.8 | 65.8 | Pass GT0 | Pass | Pass | Pass |
| | 120, 70 | Pass | 58.1 | 65.3 | Pass GT0 | Pass | Pass | Pass |
| | 180, 70 | Pass | 58.9 | 64.5 | Pass GT0 | Pass | Pass | Pass |
| 14 | 60, 70 | Pass | 56.2 | 54.9 | Pass GT0 | Pass | Pass | Pass |
| | 120, 70 | Pass | 58.8 | 57.8 | Pass GT0 | Pass | Pass | Pass |
| | 180, 70 | Pass | 58.6 | 57.8 | Pass GT0 | Pass | Pass | Pass |

Comparative Adhesives 1-7

| Adhesive | Cure Conditions X, Y | Solder resistance | Gloss Pre-solder | Gloss Post-solder | X-hatch Adhesion | Pencil Hardness | Solvent Resistance | Flexibility |
|---|---|---|---|---|---|---|---|---|
| C1 | 60, 70 | Pass | 40.1 | 43.8 | Pass GT0 | Pass | Pass | Pass |
| | 120, 70 | Pass | 45.8 | 44.4 | Pass GT0 | Pass | Pass | Pass |
| | 180, 70 | Pass | 44.2 | 47.8 | Pass GT0 | Pass | Pass | Pass |
| C2 | 60, 70 | Pass | 48.9 | 50.7 | Pass GT0 | Pass | Pass | Pass |
| | 120, 70 | Pass | 46.4 | 48.9 | Pass GT0 | Pass | Pass | Pass |
| | 180, 70 | Pass | 48.9 | 47.5 | Pass GT0 | Pass | Pass | Pass |
| C3 | 60, 70 | Pass | 45.1 | 47.9 | Pass GT0 | Pass | Pass | Pass |
| | 120, 70 | Pass | 49.7 | 50.3 | Pass GT0 | Pass | Pass | Pass |
| | 180, 70 | Pass | 50.7 | 52.6 | Pass GT0 | Pass | Pass | Pass |
| C4 | 60, 70 | Pass | 48.8 | 51.8 | Pass GT0 | Pass | Pass | Pass |
| | 120, 70 | Pass | 49.6 | 51.6 | Pass GT0 | Pass | Pass | Pass |
| | 180, 70 | Pass | 50.3 | 49.7 | Pass GT0 | Pass | Pass | Pass |
| C5 | 60, 70 | Pass | 38.9 | 40.8 | Pass GT0 | Pass | Pass | Pass |
| | 120, 70 | Pass | 44.8 | 44.3 | Pass GT0 | Pass | Pass | Pass |
| | 180, 70 | Pass | 46.8 | 48.7 | Pass GT0 | Pass | Pass | Pass |
| C6 | 60, 70 | Pass | 54.7 | 63.1 | Pass GT0 | Pass | Pass | Pass |
| | 120, 70 | Pass | 58.3 | 63.2 | Pass GT0 | Pass | Pass | Pass |
| | 180, 70 | Pass | 60.4 | 63.5 | Pass GT0 | Pass | Pass | Pass |
| C7 | 60, 70 | Pass | 53.6 | 54.4 | Pass GT0 | Pass | Pass | Pass |
| | 120, 70 | Pass | 60.3 | 59.4 | Pass GT0 | Pass | Pass | Pass |
| | 180, 70 | Pass | 59.5 | 60.1 | Pass GT0 | Pass | Pass | Pass |

All of these test results show inventive adhesives and comparative adhesives to be equal. All are pass.

A minimum cure schedule of 30 minutes at 150° C. followed by 20 minutes at 250° C. will lead to all adhesives systems 1-14 and comparative adhesives 1-7 passing a 10 second solder dip at lead-free solder temperatures of ≥288° C.

Viscosity Stability Test Results

Viscosity stability for inventive adhesives 1-14 plus comparative adhesives 1-7 over a three month period at 15° C.:
Inventive Adhesives 1-7

|  | Viscosity | | | | | | |
| --- | --- | --- | --- | --- | --- | --- | --- |
| Time Frame | 1 | 2 | 3 | 4 | 5 | 6 | 7 |
| Initial, Pa · s | 7.5 | 10.5 | 8.7 | 13.5 | 11.8 | 19.8 | 13.9 |
| 1 Month, Pa · s | 7.6 | 12.8 | 8.9 | 14.8 | 12.3 | 20.2 | 14.5 |
| 2 Months, Pa · s | 8.0 | 17.8 | 9.3 | 17.1 | 14.7 | 21.4 | 16.1 |
| 3 Months, Pa · s | 8.7 | 27.8 | 9.9 | 22.5 | 17.8 | 23.7 | 19.1 |

Inventive Adhesives 8-14

|  | Viscosity | | | | | | |
| --- | --- | --- | --- | --- | --- | --- | --- |
| Time Frame | 8 | 9 | 10 | 11 | 12 | 13 | 14 |
| Initial, Pa · s | 6.4 | 8.6 | 7.3 | 10.6 | 9.4 | 16.7 | 10.7 |
| 1 Month, Pa · s | 6.5 | 10.4 | 7.5 | 13.2 | 10.7 | 18.9 | 11.5 |
| 2 Months, Pa · s | 6.9 | 15.9 | 8.1 | 17.5 | 12.2 | 19.4 | 13.4 |
| 3 Months, Pa · s | 7.9 | 23.6 | 8.7 | 21.7 | 14.7 | 20.1 | 16.6 |

Comparative Adhesives 1-7

| Time Frame | Viscosity | | | | | | |
| --- | --- | --- | --- | --- | --- | --- | --- |
|  | C1 | C2 | C3 | C4 | C5 | C6 | C7 |
| Initial, Pa · s | 7.3 | 10.1 | 8.3 | 13.0 | 11.1 | 19.0 | 13.1 |
| 1 Month, Pa · s | 13.2 | 31.5 | 25.3 | 46.3 | 37.5 | >100 | 49.7 |
| 2 Months, Pa · s | 29.5 | >100 | 68.5 | >100 | >100 | >100 | >100 |
| 3 Months, Pa · s | 67.3 | >100 | >100 | >100 | >100 | >100 | >100 |

Viscosities were checked using a cone and plate Haake VT550 @ 25° C., 25 mm cone at 20 s$^{-1}$ The aforementioned tests qualify the physical properties of the polyamideimide-containing adhesive of the invention and highlight it's suitability for use as an adhesive in electronic applications such as the production of flexible printed circuit boards.

Production of Flexible Printed Circuit Boards

As an example, liquid polyamideimide adhesives can be used for the production of flexible multilayer PCBs.

The following adhesive formulation was used in the below testing/example scheme

| Material | Adhesive 15 |
| --- | --- |
| Inventive Resin 1 | 75.65 |
| Epoxy resin 2 - Epiclon N673 ECN (68.76%)[2] | 15.61 |
| Leveling aid - Foamblast UVD[4] | 0.97 |
| Cure Agent 1 - Omicure DDA5 Dicy[5] | 0.51 |
| Cure Agent 2 - Curezol 2MZ-Azine[6] | 0.51 |
| Filler 1 - Viatalc VT10 Talc[7] | 4.81 |
| Filler 2 - Aerosil R974 Silica[8] | 1.94 |
| Total | 100 |

[2]DIC Europe
[4]Samuel Banner & Co Ltd
[5]Hubron Speciality Ltd
[6]Lansdowne Chemicals PLC
[7]Viaton Industries Ltd
[8]Evonik Degussa GmbH Example Application of Polyamideimide Adhesive by Flatbed Screen Printing:

Mesh used: 43 T/cm polyester block[1]

10 mm screen snap off height

65/70 shore squeegee used

Hold: Panel racked vertically for about 10 min. at room temperature.

Bake: Panel is then oven baked at elevated temperature (for example about 150° C.) for about 60 minutes to tack dry the panel[2], followed by a lamination step of about 70 minutes at elevated temperature (for example about 180° C.) to fully cure the panel.

[1]Other screens can be used depending on required dry film thickness.
[2]Other "tack dry" conditions are possible for all application methods; times will depend on wet film weight and oven types.

Modification of the liquid adhesives (e.g. the addition of solvent and/or rheological additives) would lead to other application methods including virtually all forms of contact and non-contact printing, examples of which include but are not limited to screen printing; rotary screen printing; roller coating; dip coating; curtain coating; flood coating; spray coating (electrostatic and air); spin coating; inkjet; gravure; offset; flexo; dispensing; pad printing; brushing (including touching up damaged areas of finished film); inkjet; aerosol deposition; etc.

One preferred method of deposition is dispensing—a digital process for application of product onto selected areas whereby liquids are being applied through nozzles of the dispenser. The advantage of dispensing is to apply product onto a low number of panels as in prototyping jobs (e.g. no screen preparation has to be done, the data is digitally supplied).

The use of dispensers is well known in the PCB industry and the inventive methods of applying liquid adhesives by dispensing could be particularly advantageous in terms of cost savings when used in shorter production runs (number of panels of the same type) typically found in prototype shops, as well as with other jobs involving short production runs (e.g. below 20 panels) which are increasing in popularity.

Another advantage related to the dispensing of liquid adhesives is the transfer of production data from CAD-department (Computer Added Design) directly to the dispenser. When using dry film-type adhesives, there is a need to produce artwork which is a longer, more complicated and time consuming process.

In addition to providing advantageous cost and time saving features, it is understood that the inventive method of applying liquid adhesives by the application methods described in this application will produce finished parts that perform according to the requirements of relevant standards for rigid/flex circuitry (e.g. IPC-A-600G) as well as the other standards and test protocol well known in the art.

Another possible use for the application of liquid adhesives includes a bonding highly weatherable layers such as insulating layers for photovoltaic modules, which can be used in conjunction with a variety of substrates using any of the disclosed methods.

Figure 3:
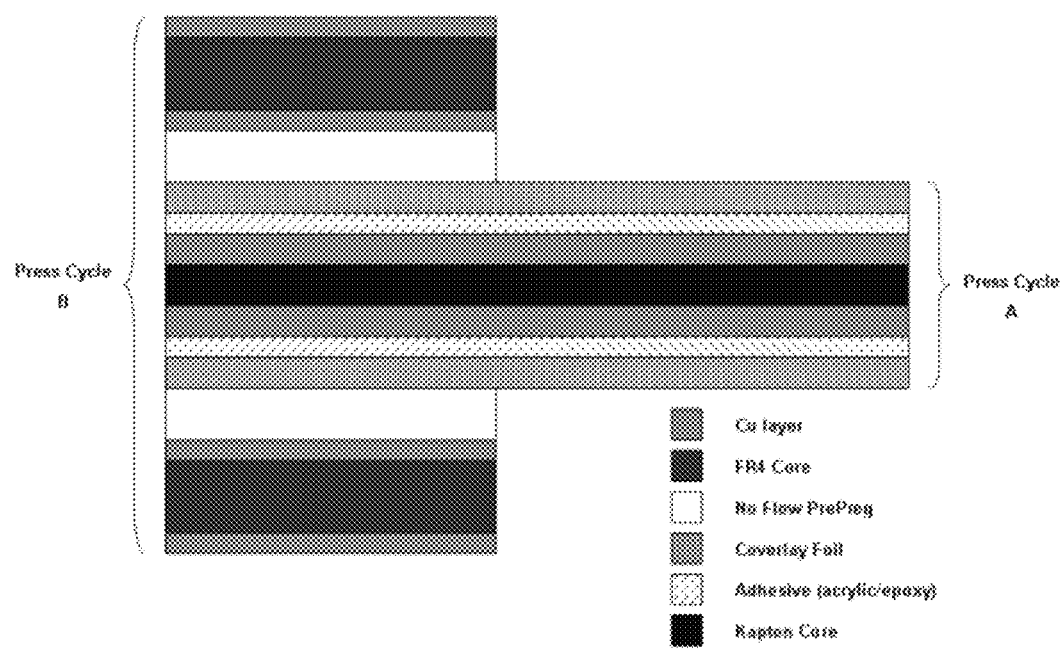
FIG. 3 shows a rigid/flex panel with separate coverlay foil, adhesive and no flow prepreg layers.
Figure 4:
FIG. 4 shows a layer rigid/flex panel using liquid screen printed adhesive.

FIGS. 3 and 4 are two diagrams showing "layups" of the individual layer materials to form a rigid-flex circuit board.

FIG. 3 shows the build up of a typical multilayer, rigid-flex circuit. The key indicates which materials are used for each layer. The lay-up begins with 'Press Cycle A' which is shown to the right of the drawing. In this example a Kapton® core (Kapton® is the name of the material as sold on the market by DuPont), which is a polyimide dry film with copper foils on either side. A layer of acrylic or epoxy adhesive is then placed over the copper-clad polyimide in order to provide adhesion to the coverlay foil outer layers after a lamination cycle. This is the first lay-up and forms the flexible part of the rigid-flex circuit board. It is shown as Press cycle A and this package has to be pressed using about 185° C. in a cycle that lasts 2-3 hours. To produce the left part of the PCB of FIG. 3, the lay-up begins with the pressed part A and adding the materials shown (No Flow Prepreg, copper layer, FR4 core, copper layer) on both sides. Using these materials, the rigid part of the rigid-flex circuitry is produced. A second press cycle, shown as 'Press cycle B', is needed to complete the multilayer circuit board.

FIG. 4 illustrates how the same circuit board can be produced by applying a liquid adhesive (e.g. Adhesive 15). On the right block, Adhesive 15 replaces the coverlay foil and avoids the extra adhesive layer of FIG. 11 (typically acrylic or epoxy). This flexible part does not need a press cycle so this time consuming process step can be eliminated. After an oven drying step for the Adhesive 15, the lay-up is ready to be handled and can be used along with the rigid part as with FIG. 3, to complete the lay-up for the multilayer circuit. Only one final press cycle is needed. As a result of using the liquid adhesive of the invention in this lay-up, the No Flow Prepreg present in the rigid part of the board can also be eliminated, providing the pre-dry stage has removed sufficient solvent from the adhesive film. This elimination of the No Flow Prepreg results in material and process costs savings, as well as allowing for thinner circuit constructions as demonstrated in FIG. 4.

Test Data for the Use of Liquid Polyamideimide Adhesives

The following examples demonstrate the adhesive properties of liquid polyamideimides, in all cases using Adhesive 15 as previously described.

Example 1

Use of Temperature to Control Flow Properties of Liquid Polyamideimide Adhesive

Two Copper-clad FR4 PCB panels (A & B) were coated with 2 layers of Adhesive 15 using the following parameters:
Screen Printing: 43T Polyester Mesh, 10 mm snap-off, 65 shore squeegee
First Layer pre-dried at 80° C. for 30 minutes in a hot-air convection oven.
Second layer applied and dried for 60 minutes at 80° C. (Panel A) and 120 ° C. (Panel B).
Dry film thickness achieved using these parameters was 20 microns.
Two clear glass slides measuring 25.4×76.2×1.2 mm were then placed onto each panel as shown in FIGS. 5 (cross section) and 6 (view from above). Both Panels were then layed up with press pads and a release layer covering the surfaces. The panels were then laminated under vacuum using a Buhler press at a pressure of 25 Bar and temperature of 195° C. for 60 minutes. After cooling, the Panels were inspected for signs of the Adhesive 15 'flowing' during the lamination process.

When compared, the Panels show that when the Adhesive 15 is dried at lower pre-dry temperatures (80° C.), the resin flows during the press cycle as demonstrated in FIG. 7. However, the panel which had seen a temperature of 120° C. during pre-dry did not show any signs of 'flow' around the edges of the glass slides, FIG. 8. This behavior is typical of products sold as 'no-flow' prepregs for multilayer PCBs and demonstrates how the amount of resin flow during lamination when using Adhesive 15, can be controlled by the adjusting the pre-dry temperatures.

Example 2

Adhesion Test for Liquid Polyamideimide Adhesive using FR4, Copper and Glass

One panel of bare FR4 PCB laminate and one panel of copper-clad FR4 PCB laminate were coated with 2 layers of Adhesive 15 using the following parameters:
Screen Printing: 43T Polyester Mesh, 10 mm snap-off, 65 shore squeegee
First Layer pre-dried at 80° C. for 30 minutes in a hot-air convection oven.
Second layer applied and dried for 60 minutes at 120° C.
Dry film thickness of 20 microns was achieved using these parameters.
Three clear glass slides measuring 25.4×76.2×1.2 mm were then placed onto the coated copper-clad FR4 PCB panel as shown in FIG. 9. The bare FR4 PCB Panel was then placed on top with the Adhesive 15 coating between the glass and the FR4. This created a simple multilayer stack to give the following build-up layers: Copper/Adhesive 15/Glass/Adhesive 15/FR4. The multilayer stack was then layed up with press pads and a release layer covering the outer surfaces. The panel was then laminated under vacuum using a Buhler press at a pressure of 25 Bar and temperature of 195° C. for 60 minutes.

After lamination, the strength of the adhesive was tested by levering the FR4 and copper surface apart with a screwdriver. After enough force was applied the two panels came apart and were inspected to identify the surfaces where the failure in adhesion had occurred. In this particular example, failure had occurred internally within the glass slides and the bonds between the Copper/Adhesive 15/Glass and between the FR4/Adhesive 15/Glass had remained intact. Therefore in this case, the Adhesive 15 had a greater peel strength than the internal strength of the glass slides themselves. This is illustrated in FIG. 10.

Example 3

Peel Strength Testing of Liquid Polyamideimide Adhesive Using Standard PCB Materials The peel strength of Adhesive 15 was tested by laminating test strips of differing substrate materials (x), which are commonly used to produce multilayer PCBs, using Adhesive 15 as the adhesive to bond the particular layers together. All tests were performed using copper-clad FR4 as the starting base material. A reference sample was also prepared using standard dry-film prepreg material in between copper clad FR4 and bare FR4 laminate. Below is an outline of how each Adhesive 15 test sample was prepared:

A Copper-clad FR4 PCB panel was coated with 2 layers of Adhesive 15 using the following parameters:
  Screen Printing: 43T Polyester Mesh, 10 mm snap-off, 65 shore squeegee
  First Layer pre-dried at 80° C. for 30 minutes in a hot-air convection oven.
  Second layer applied and dried for 60 minutes at 80° C. or 60 minutes at 120° C.
  Dry film thickness of 20 microns was achieved using these parameters.

The test substrate (x), consisting of aluminium, copper or plain FR4 laminate, was placed on top of the Adhesive 15 coated, copper-clad FR4 panel. This created a simple multilayer stack and a release layer was placed 15 mm from one edge of the panel between the substrate materials under investigation as shown in FIG. 11. The multilayer stack was then laminated under vacuum using a Buhler press at a pressure of 25 Bar and temperature of 195° C. for 60 minutes. Lamination was performed within 24 hours of the coating stage to maximise the bond strength of the Adhesive 15.

After the lamination cycle, the multilayer stack was cut, using a guillotine, into individual strips measuring 10 mm×175 mm and the release layer removed from the relevant end of the strip where the two outer materials were left unbonded. The peel strength of this test strip was measured, for each material sample, using a Mark 10 EM301 motorised force gauge. The gauge was attached to the test material only using clamps and a vertical force applied over a time period of 60 seconds around a fixed metal rod, as shown in FIG. 12. Average peel strength results for each sample are recorded below and corresponding curves of Load (N) v Time (secs) were studied for consistency through the 60 second period.

| Adhesive | Base Material | Test Substrate (x) | Pre Dry (° C./mins) Layer 1 | Pre Dry (° C./mins) Layer 2 | Average Load (N) | Load Curve* |
|---|---|---|---|---|---|---|
| Std PrePreg | Cu-clad FR4 | Copper | N/A | N/A | 1.6 | C |
| Std PrePreg | Cu-clad FR4 | Copper | N/A | N/A | 1.2 | C |
| Adhesive 15 | Cu-clad FR4 | Copper | 80/30 | 80/60 | 1.6 | C |
| Adhesive 15 | Cu-clad FR4 | Copper | 80/30 | 80/120 | 1.9 | C |
| Adhesive 15 | Cu-clad FR4 | Aluminium | 80/30 | 80/60 | 3.7 | I |
| Adhesive 15 | Cu-clad FR4 | Aluminium | 80/30 | 80/120 | 3.6 | I |
| Adhesive 15 | Cu-clad FR4 | FR4 | 80/30 | 80/60 | 2.0 | C |
| Adhesive 15 | Cu-clad FR4 | FR4 | 80/30 | 80/120 | 3.1 | C |

*C = Consistent: Curve is consistent about the average load in Newtons for the 60 second time period. I = Inconsistent: Load values fluctuate about the average load value over the 60 second time period.

The present invention has been described in detail, including the preferred embodiments thereof. However, it will be appreciated that those skilled in the art, upon consideration of the present disclosure, may make modifications and/or improvements on this invention that fall within the scope and spirit of the invention

The invention claimed is:

1. A liquid, thermal-curing, adhesive composition, comprising a polyamideimide having a terminal isocyanate group blocked by a thermally-dissociatable isocyanate-blocking group, an aprotic solvent, and an additional thermally curable component wherein the polyamideimide is prepared from a reaction mixture with a molar ratio of diisocyanate to isocyanate-blocking agent of approximately 10:0.1 to 10:2 and wherein the isocyanate-blocking group is an aliphatic amide.

2. The composition of claim 1, wherein the polyamideimide having a terminal isocyanate group blocked by a thermally-dissociatable isocyanate-blocking group is the reaction product of (i) a polyamideimide having a terminal isocyanate group and (ii) an aliphatic amide.

3. The composition of claim 2, wherein the aliphatic amide is a 5 to 8-membered lactam optionally substituted with one or more $C_1$-$C_4$ alkyl groups.

4. The composition of claim 3, wherein the 5 to 8-membered lactam is ∈-caprolactam.

5. The composition of claim 1, wherein the polyamideimide having a terminal isocyanate group blocked by a thermally-dissociatable isocyanate-blocking group has the formula (I):

[B]—C(O)-[A]$_n$-OH          (I)

wherein: [A]$_n$ is a polyamideimide unit in which n is at least 4; and [B] is a thermally-dissociatable isocyanate-blocking group.

6. The composition of claim 5, wherein [B] is —N($R_1$)—C(O)$R_2$, wherein either (a) $R^1$ and $R^2$ are each independently selected from $C_1$-$C_6$ alkyl; or (b) $R^1$, $R^2$ and the amide group to which they are attached together form a 5 to 8-membered lactam ring, optionally substituted with one or more $C_1$-$C_4$ alkyl groups.

7. The composition of claim 6, wherein $R^1$, $R^2$ and the nitrogen atom and carbonyl group to which they are attached together forms a 5 to 8-membered lactam ring, optionally substituted with one or more methyl groups.

8. The composition of claim 1, wherein the thermally-dissociatable isocyanate-blocking group dissociates at a temperature in the range of from 100° C. to 250° C.

9. The composition of claim 8, wherein the thermally-dissociatable isocyanate-blocking group dissociates at a temperature in the range of from 140° C. to 200° C.

10. The composition of claim 1, wherein the composition is a liquid at 25° C. and wherein the composition has a viscosity of less than 35 Pa·s at 25° C. after storage for three months at 15° C.

11. The composition of claim 10, wherein there is no more than a 3.5-fold increase in the viscosity at 25° C. after storage for three months at 15° C.

12. The composition of claim 1, wherein the further thermally curable component is a multifunctional epoxy resin.

13. The composition of claim 1, further comprising a leveling aid, a thermal curing promoter, a stabiliser, and/or a filler.

14. The composition of claim 1, having a solids content of at least 20 wt %.

15. A method of bonding two articles to one another comprising the steps of
  (a) providing a first article with the liquid, thermal-curing, adhesive composition as defined in claim 1,
  (b) contacting a second article with the adhesive composition, and then
  (c) curing the adhesive composition.

16. The method of claim 15, in which the composition is cured by heating to a temperature of at least 150° C. in step (c).

17. The method of claim 15, wherein the composition is applied to the first article by screen printing, roller coating, dip coating, curtain coating, spray coating, spin coating, ink jet, gravure coating, offset coating, flexo coating, dispensing, pad printing, brushing, flood coating or aerosol deposition.

18. The method of claim 17, wherein the composition is applied by screen printing.

19. The method of claim 15, wherein the first and second articles are layers of a multilayer laminate.

20. The method of claim 15, wherein the first article is a stiffener member or a heat sink and the second article is a base board.

21. The method of claim 15, wherein the method is used in the preparation of an electronic component.

22. The method of claim 21 wherein the electronic component is a flexible printed circuit board or rigid-flexible printed circuit board.

23. A flexible printed circuit board or rigid-flexible printed circuit board comprising a cured adhesive of the liquid, thermal-curing, adhesive composition as defined in claim 1.

24. A two-pack system for use in preparing a liquid, thermal-curing, adhesive composition comprising a first component comprising a polyamideimide having a terminal isocyanate group blocked by a thermally-dissociatable isocyanate-blocking group; and a second component comprising a thermal curing promoter or a further thermally-curable compound, wherein either the first or second component additionally comprises an aprotic solvent;

wherein the polyamideimide is prepared from a reaction mixture with a molar ratio of diisocyanate to isocyanate-blocking agent of approximately 10:0.1 to 10:2 and wherein the isocyanate-blocking group is an aliphatic amide.

25. The two-pack system of claim 24, for use in preparing a liquid, thermal-curing, adhesive composition comprising a polyamideimide, wherein the composition is a liquid at 25° C. and wherein the composition has a viscosity of less than 35 Pa·s at 25° C. after storage for three months at 15° C.

* * * * *